US012707954B2

(12) United States Patent
Fornara et al.

(10) Patent No.: US 12,707,954 B2
(45) Date of Patent: Aug. 11, 2026

(54) SEMICONDUCTOR DEVICE AND METHOD OF FORMING THE SAME

(71) Applicant: STMicroelectronics International N.V., Geneva (CH)

(72) Inventors: Pascal Fornara, Pourrières (FR); Antonin Chollet, Aix-en-Provence (FR); Julien Amouroux, Aix en Provence (FR)

(73) Assignee: STMICROELECTRONICS INTERNATIONAL N.V., Geneva (CH)

(*) Notice: Subject to any disclaimer, the term of this patent is extended or adjusted under 35 U.S.C. 154(b) by 514 days.

(21) Appl. No.: 18/319,132

(22) Filed: May 17, 2023

(65) Prior Publication Data

US 2024/0387328 A1 Nov. 21, 2024

(51) Int. Cl.

| | |
|---|---|
| ***H10W 20/20*** | (2026.01) |
| ***H10D 62/10*** | (2025.01) |
| ***H10W 10/00*** | (2026.01) |
| ***H10W 10/20*** | (2026.01) |
| ***H10W 20/00*** | (2026.01) |

(52) U.S. Cl.

CPC .......... *H10W 20/20* (2026.01); *H10D 62/115* (2025.01); *H10W 10/021* (2026.01); *H10W 10/20* (2026.01); *H10W 20/074* (2026.01)

(58) Field of Classification Search

CPC . H10W 20/20; H10W 20/072; H10W 10/021; H10W 10/20; H10D 62/115

See application file for complete search history.

(56) References Cited

U.S. PATENT DOCUMENTS

| | | | | |
|---|---|---|---|---|
| 9,466,563 | B2 | 10/2016 | Mignot et al. | |
| 10,749,031 | B2 | 8/2020 | Cai et al. | |
| 2002/0149085 | A1* | 10/2002 | Lin | H10W 20/495 257/E23.013 |
| 2009/0309230 | A1* | 12/2009 | Cui | H10W 20/495 257/773 |
| 2016/0027726 | A1 | 1/2016 | Zhu et al. | |
| 2021/0175166 | A1 | 6/2021 | McGahay et al. | |
| 2021/0242110 | A1* | 8/2021 | Hsu | H10W 20/47 |

FOREIGN PATENT DOCUMENTS

| | | |
|---|---|---|
| CN | 102683274 A | 9/2012 |

* cited by examiner

*Primary Examiner* — Douglas M Menz

(74) *Attorney, Agent, or Firm* — Slater Matsil, LLP

(57) ABSTRACT

A method for manufacturing a semiconductor device includes depositing a first protective layer over a first conductive feature and a second conductive feature. The first protective layer covers respective sidewalls and top surfaces of the first conductive feature and the second conductive feature. A portion of the first protective layer between the first conductive feature and the second conductive feature is removed. After removing the portion of the first protective layer, an intermetal dielectric layer is formed between the first conductive feature and the second conductive feature.

20 Claims, 40 Drawing Sheets

100
146
142
116
104
170
170
D1
114
112
124
122
120
110
106
108
105
102

100
170
170
120
124
122
112
114
142
110
106
108
102
174
116
104

100
164
154
194
186
184
116
104
240
240
202
198 196
120
124
122
250
250
110
106
108
102
112
114

SEMICONDUCTOR DEVICE AND METHOD OF FORMING THE SAME

TECHNICAL FIELD

The present invention relates generally to semiconductor processes and, in particular embodiments, to the manufacturing of semiconductor devices.

BACKGROUND

Semiconductor devices are formed with circuit components on and/or in a substrate layer. The substrate layer may, for example, be a bulk semiconductor substrate or silicon on insulator substrate (SOI). The fabrication of the circuits is referred in the art as a front end of line (FEOL) process. After the FEOL process is completed, the fabrication of the device is finished by forming a network of signal and power paths to connect to the circuit components. This is referred in the art as a back end of line (BEOL) line process.

Routing of the paths in the BEOL process requires the formation of multiple levels (or layers) of metallization over the substrate layer that includes the circuits formed during the FEOL process. The metallization includes metal vias which extend perpendicular to a top surface of the substrate layer and metal lines which extend parallel to the top surface of the substrate layer. It is common to use copper (Cu) as the metal material for the vias and lines, although it is known in the art to use other metal materials as well. The metallization includes an insulating dielectric material at each level, with the vias and lines being surrounded by the insulating dielectric material. As semiconductor devices become smaller and more complex, there is a corresponding increase in the complexity of the BEOL metallization including a requirement for increasingly smaller dimensioned metallization structures.

SUMMARY

In accordance with an embodiment, a method for manufacturing a semiconductor device includes: forming a first conductive feature and a second conductive feature over a substrate; depositing a first protective layer over the first conductive feature and the second conductive feature, the first protective layer covering respective sidewalls and top surfaces of the first conductive feature and the second conductive feature; removing a portion of the first protective layer between the first conductive feature and the second conductive feature; and after removing the portion of the first protective layer, forming an intermetal dielectric layer between the first conductive feature and the second conductive feature.

In accordance with another embodiment, a method for manufacturing a semiconductor device includes: forming a first metal line and a second metal line over a substrate; conformally depositing a first dielectric layer over the first metal line and the second metal line, where the first dielectric layer includes a dent between the first metal line and the second metal line; recessing the first dielectric layer with an anisotropic etch process, where after the anisotropic etch process the dent extends below top surfaces of the first metal line and the second metal line; forming a first protective layer over the first dielectric layer; removing a portion of the first protective layer over the dent, where remaining portions of the first protective layer have respective umbrella shaped profiles in a cross-sectional view; etching a hole through the first dielectric layer in the position of the dent; and widening the hole into a space with an isotropic etch process.

In accordance with yet another embodiment, a semiconductor device includes: a first conductive feature and a second conductive feature over a substrate; a dielectric layer between the first conductive feature and the second conductive feature; an air gap in the dielectric layer between the first conductive feature and the second conductive feature; a protective layer over the first conductive feature, the second conductive feature, and the dielectric layer; and a first opening through the protective layer, a second opening through the protective layer, and a third opening through the protective layer, the first opening, the second opening, and the third opening being over the air gap, where the first opening, the second opening, and the third opening form a triangle in a plan view.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
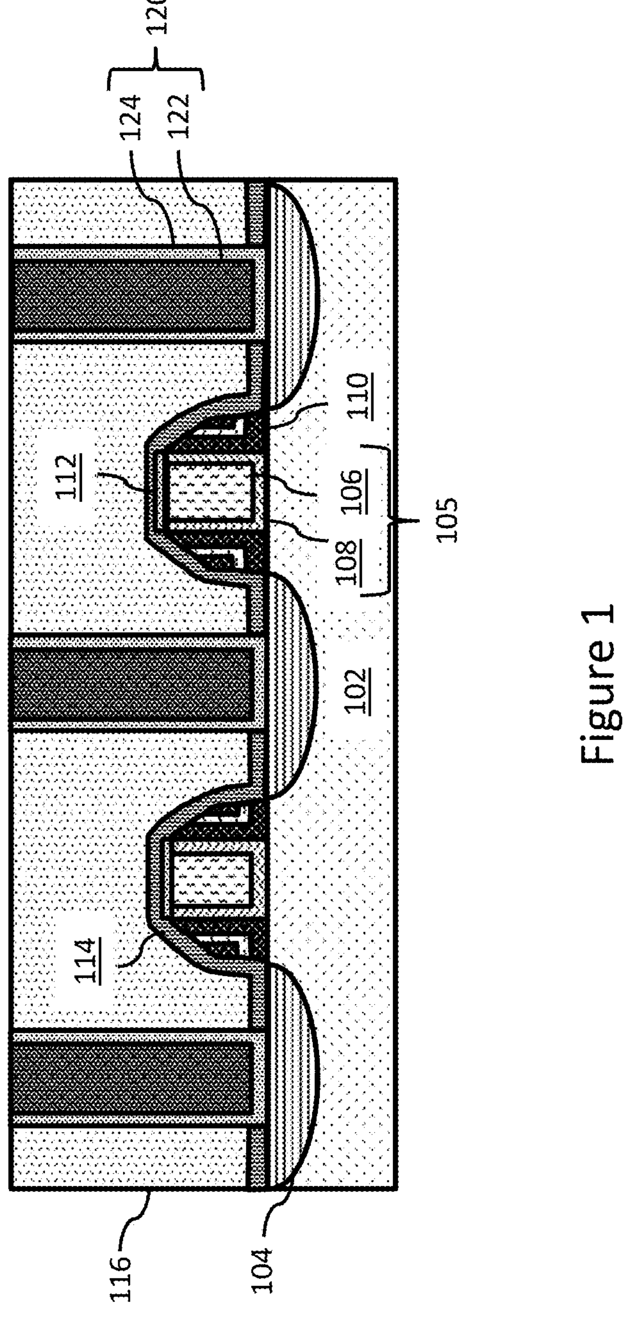
FIG. 1 illustrates an example semiconductor structure, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. The references used herein are provided merely for convenience and hence do not define the extent of protection or the scope of the embodiments.

According to one or more embodiments of the present disclosure, this application relates to forming protective layers on conductive features of BEOL structures (e.g., metal lines) and forming air gaps in dielectric layers of the BEOL structures and underlying FEOL structures. Protective layers may comprise, e.g., nitride and are advantageous by protecting sidewalls and/or top surfaces of conductive features from damage in subsequent processes (e.g., dry and wet etch processes to form air gaps). Protective layers may be formed with umbrella shaped profiles in a cross-sectional view, which may reduce the heights of seams at the tops of subsequently formed air gaps.

It may be advantageous to form air gaps and thereby decrease the dielectric constant of the insulating dielectric material of the BEOL structures and underlying FEOL structures. This may reduce electric shorts between adjacent conductive features. The air gaps may be formed in a staggered pattern so that adjacent air gaps merge together and advantageously increase the total air gap volume.

Embodiments of the disclosure are described in the context of the accompanying drawings. An embodiment of an example semiconductor structure will be described using FIG. 1. An embodiment of a semiconductor manufacturing process including forming protective layers over conductive features will be described using FIGS. 2-10. An embodiment of another semiconductor manufacturing process including forming protective layers over conductive features will be described using FIGS. 11-18. An embodiment of yet another semiconductor manufacturing process including forming protective layers over conductive features will be described using FIGS. 19-26. An embodiment of a semiconductor manufacturing process including forming protective layers over conductive features with umbrella-shaped profiles will be described using FIGS. 27-35. Embodiments of semiconductor devices including air gaps with staggered openings will be described using FIGS. 36A-36C. An embodiment of a method for manufacturing a semiconductor device will be described using FIG. 37. An embodiment of another method for manufacturing a semiconductor device will be described using FIG. 38.

FIG. 1 illustrates a cross-sectional view of an example semiconductor structure 100, in accordance with some embodiments. The semiconductor structure 100 includes a substrate 102, over which active devices are formed. In some embodiments, the substrate 102 is made of silicon or is a silicon-on-insulator (SOI) substrate that includes a buried oxide layer. Transistor gate structures 105 (e.g., planar FETs, FinFETs, or the like) are formed on the substrate 102. Although two transistor gate structures 105 are illustrated in FIG. 1, any suitable number of transistor gate structures 105 may be formed.

As illustrated in FIG. 1, each transistor gate structure 105 comprises a gate electrode 106 and a gate dielectric 108 between the gate electrode 106 and the substrate 102. In some embodiments, the gate electrode 106 comprises a conductive material such as tungsten, titanium, copper, gold, tin, silver, the like, or a combination thereof. In other embodiments, the gate electrode 106 is a dummy gate comprising, e.g., polysilicon. The gate dielectric 108 extends between the gate electrode 106 and the substrate 102. The gate dielectric 108 may cover sidewalls of the gate electrode 106. In some embodiments, the gate dielectric 108 comprises silicon oxide, silicon dioxide, the like, or a combination thereof. The gate dielectric 108 may be a thermal oxide. In some embodiments, a cap layer 112 covers top surfaces of the gate electrode 106 and the gate dielectric 108. The cap layer 112 comprises a suitable conductive material, such as titanium, titanium nitride, tantalum, tantalum nitride, the like, or a combination thereof. However, any suitable material may be used for the cap layer 112.

Each transistor gate structure 105 may be between respective gate spacers 110 (also referred to as sidewall spacers). In some embodiments, the gate spacers 110 are formed on opposite sides of dummy gates in a gate last process, which are subsequently removed and replaced with respective transistor gate structures 105 (also referred to as replacement gates). In other embodiments, the gate spacers 110 are formed on either side of transistor gate structures 105 in a gate first process. The gate spacers 110 comprise one or more dielectric layers. In some embodiments, the gate spacers 110 comprise silicon oxide, silicon dioxide, silicon nitride (e.g., $Si_3N_4$), the like, or a combination thereof. For example, the gate spacers 110 may comprise a first layer of silicon nitride, a second layer of silicon dioxide over the first layer, and a third layer of silicon nitride over the second layer. As illustrated in FIG. 1, the gate spacers 110 may comprise first and second layers with L-shaped profiles in a cross-sectional view.

Source/drain regions 104 (also referred to as source regions and drain regions) are formed in the substrate 102 adjacent to and/or between the transistor gate structures 105. The source/drain regions 104 may be formed by, for example, etching recesses adjacent to and/or between the transistor gate structures 105 and epitaxially growing silicon and/or silicon germanium in the recesses. In some embodiments, facets of the source/drain regions 104 extend above a top surface of the substrate 102. The source/drain region 104 located between the adjacent transistor gate structures 105 includes a source region for one transistor gate structure 105 and a drain region for the other transistor gate structure 105.

An etch stop layer 114 is formed over the transistor gate structures 105, the source/drain regions 104, and the gate spacers 110. The etch stop layer 114 may be used to control subsequent etch processes used to form contacts to, e.g., the source/drain regions 104 or the transistor gate structures 105. Therefore the etch stop layer 114 is also referred to as a contact etch stop layer. In some embodiments, the etch stop layer 114 comprises a nitride such as silicon nitride. However, any suitable material (for example, hafnium oxide ($HfO_2$)) may be used.

A pre-metal dielectric (PMD) layer 116 is formed over the etch stop layer 114. In some embodiments, the PMD layer 116 comprises silicon oxide, silicon dioxide, the like, or a combination thereof, and is formed with a suitable process (e.g., a phosphosilicate glass high density plasma (PSG HDP) deposition or a conventional oxide formed by a tetraethyl orthosilicate (TEOS) deposition, such as with plasma-enhanced (PE) CVD). In other embodiments, the PMD layer 116 comprises Borophosphosilicate glass (BPSG), undoped silicate glass (USG), the like, or a combination thereof. However, the PMD layer 116 may comprise any suitable material.

Contacts 120 are formed through the PMD layer 116 and through the etch stop layer 114 to physically and electrically contact the source/drain regions 104. Openings for the contacts 120 may be formed with suitable patterning and etch processes.

Next, a barrier layer 124 is conformally deposited in the openings. The barrier layer 124 comprises a suitable conductive material such as tantalum, tantalum nitride, titanium, titanium nitride, the like, or a combination thereof. The barrier layer 124 is formed with a suitable method such as CVD, PVD, ALD, electroplating, or the like. A conductive fill material 122 is formed over the barrier layer 124 to fill the openings. In some embodiments, the conductive fill material 122 comprises tungsten, cobalt, copper, tin, gold, silver, the like, or a combination thereof. The conductive fill material is formed with a suitable method such as CVD, PVD, ALD, electroplating, or the like. Top portions of the barrier layer 124 and the conductive fill material 122 may be removed with a suitable planarization process, such as a chemical mechanical polish (CMP). The contacts 120 comprise the remaining portions of the conductive fill material 122 and the barrier layer 124.

FIGS. 2-26 illustrate various embodiments of processes for forming protective layers over conductive features and forming air gaps in adjacent dielectric layers. Conductive features such as metal lines (also referred to as metallization lines) may be sensitive elements that can be damaged in subsequent steps of manufacturing. For example, the conductive features may not be protected during different etching processes used to form air gaps in adjacent dielectric material. Sidewalls and/or top surfaces of the conductive features may be protected by protective layers (also referred to as protective cap layers or protective caps) comprising, e.g., nitride material. The protective layers may be formed over conductive features that are formed by subtractive processes or by damascene processes.

FIGS. 2-10 illustrate cross-sectional views of intermediate steps in a subtractive process for forming conductive features (e.g., metal lines) protected by a protective cap layer and for forming air gaps between and/or adjacent to the conductive features, in accordance with some embodiments. Although the structures of FIGS. 2-10 are formed using the example semiconductor structure 100 of FIG. 1, the structures of FIGS. 2-10 may be formed using any suitable semiconductor structure or substrate, and any such structures are within the scope of the disclosed embodiments.

Figure 2:
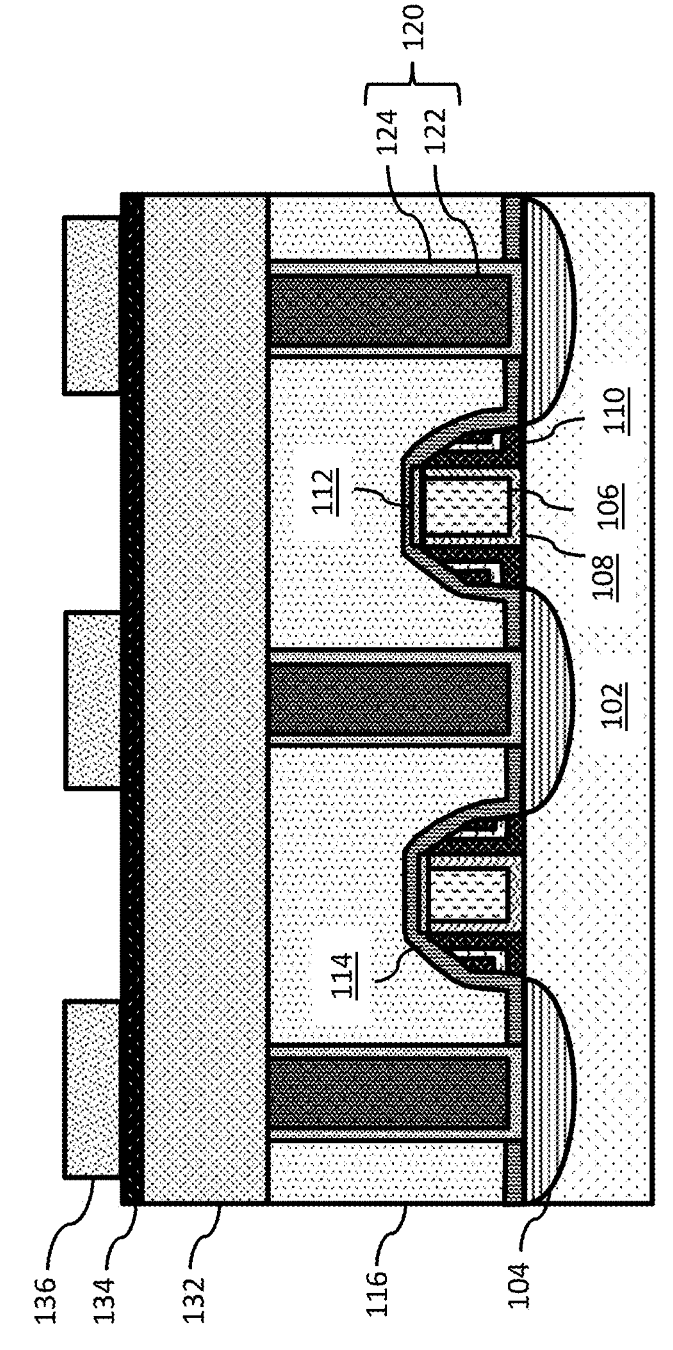
FIGS. 2-10 illustrate cross-sectional views of intermediate steps in a semiconductor manufacturing process, in accordance with some embodiments.

In FIG. 2, a conductive layer 132 is formed over the PMD layer 116 and the contacts 120 and a protective layer 134 is formed over the conductive layer 132. The protective layer 134 and the conductive layer 132 will be subsequently patterned to form conductive features protected by a protective cap layer over their respective top surfaces and sidewalls (see below, FIGS. 3-4).

The conductive layer 132 comprises a conductive material such as a metal. In some embodiments, the conductive layer 132 comprises aluminum or the like. The conductive layer 132 is formed with a suitable process, such as CVD, PVD, electroplating, or the like. However, any suitable process may be used to form the conductive layer 132.

Next, the protective layer 134 is formed over the conductive layer 132. The protective layer 134 may comprise any suitable material, such as a material that offers protection for underlying layers during an etch (e.g., an etch using HF). In some embodiments, the protective layer 134 comprises a nitride such as silicon nitride (e.g., $Si_3N_4$). The material of the protective layer 134 may be doped with, for example, boron, indium, phosphorus, arsenic, antimony, aluminum, gallium, bismuth, lithium, the like, or a combination thereof. In some embodiments, the material of the protective layer 134 is tensile or can be an aluminum oxide ($Al_2O_3$). However, the protective layer 134 is formed with a suitable method such as CVD, low pressure CVD (LPCVD), the like, or a combination thereof. However, any suitable method may be used to form the protective layer 134.

Still referring to FIG. 2, a photomask 136 is formed and patterned over the protective layer 134, such as with a suitable lithographic technique. The photomask 136 covers portions of the protective layer 134 and the conductive layer 132 that will be subsequently etched to form conductive features (e.g., metal lines) protected by a protective layer. As an example of forming the photomask 136, a photosensitive material is formed over the protective layer 134. Portions of the photosensitive material are then exposed to light (e.g., UV light). The photosensitive material is developed and etched to form the photomask 136.

Figure 3:
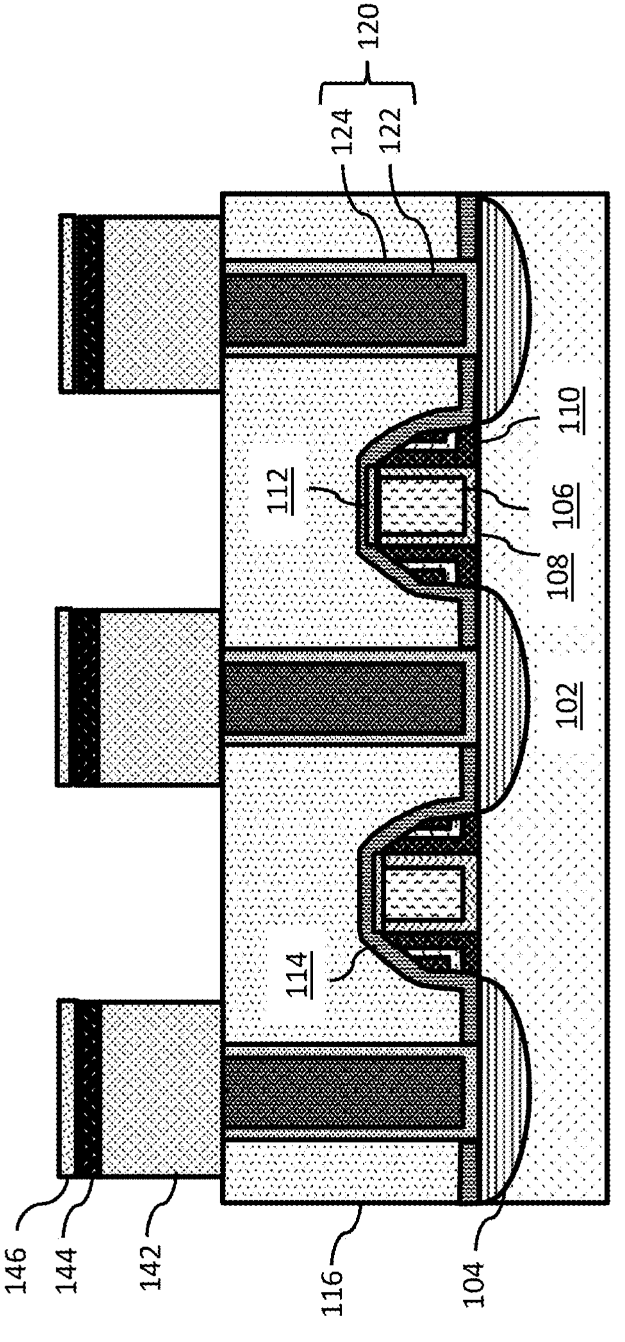

Next, in FIG. 3, the photomask 136 is used as an etching mask to pattern the protective layer 134 and the conductive layer 132 with an etch process. The patterning may be performed with a suitable anisotropic etch process, such as a RIE process. Remaining portions of the conductive layer 132 form conductive features 142 (e.g., metal lines). Remaining portions of the protective layer 134 form a patterned protective layer 144 that covers top surfaces of the conductive features 142. In some embodiments, an etched photomask 146 remains over the patterned protective layer 144. In other embodiments, the photomask 136 is removed by the etch process.

Figure 4:
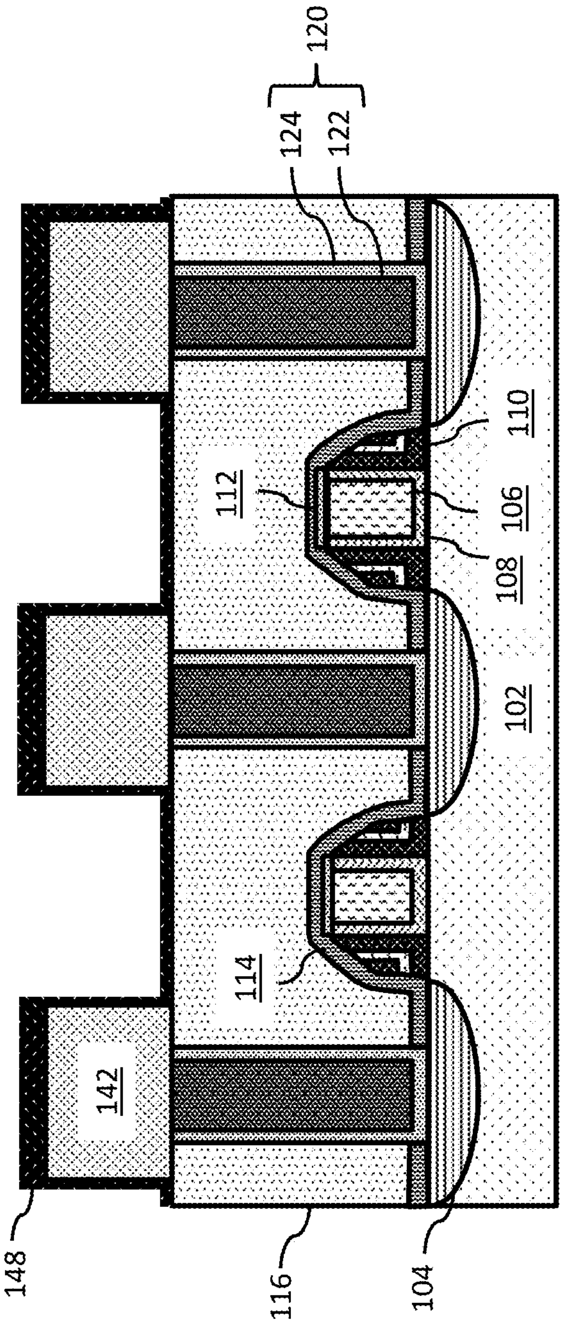

In FIG. 4, the etched photomask 146 (if present) is removed and additional protective material is conformally deposited to form a protective layer 148 over the conductive features 142 and the PMD layer 116. The etched photomask 146 may be removed by a suitable process, such as an ashing process. The additional protective material may be deposited using similar materials and methods as the protective layer 134 as described above with respect to FIG. 2, and the details are not repeated herein. A protective layer 148 is formed by the additional protective material combining with the patterned protective layer 144. The protective layer 148 covers top surfaces and sidewalls of the conductive features 142 and exposed surfaces of the PMD layer 116. In some embodiments, portions of the protective layer 148 over top surfaces of the conductive features 142 have greater respective thicknesses than respective thicknesses of the portions of the protective layer 148 over sidewalls of the conductive features 142 and respective thicknesses of the portions of the protective layer 148 over the PMD layer 116.

Figure 5:
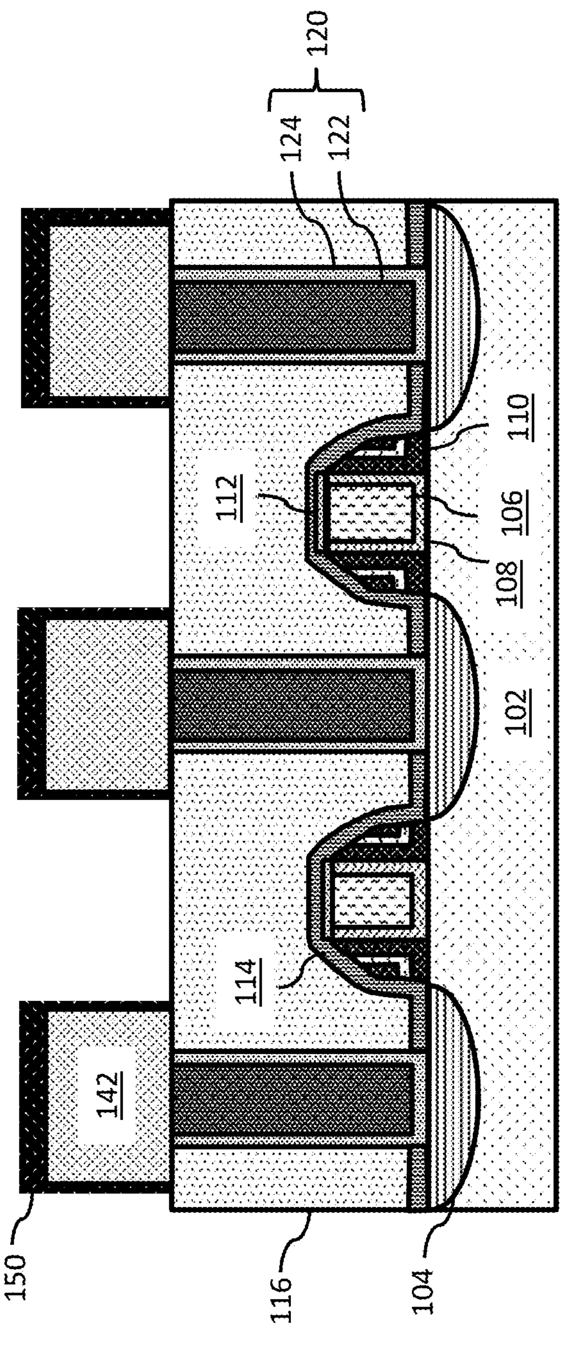

In FIG. 5, portions of the protective layer 148 over the PMD layer 116 are removed to form a protective cap layer 150. The portions of the protective layer 148 over the PMD layer 116 may be removed with a suitable process such as an anisotropic etch process (e.g., an RIE process). Removing the portions of the protective layer 148 over the PMD layer 116 may allow for the subsequent formation of larger air gaps (see below, FIGS. 9-10). The remaining portions of the protective layer 148 form a protective cap layer 150 that covers top surfaces and sidewalls of the conductive features 142. The protective cap layer 150 may protect the underlying conductive features 142 during subsequent manufacturing processes, such as the etching of air gaps (see below, FIGS. 8-10).

Figure 6:
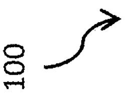
Figure 6:
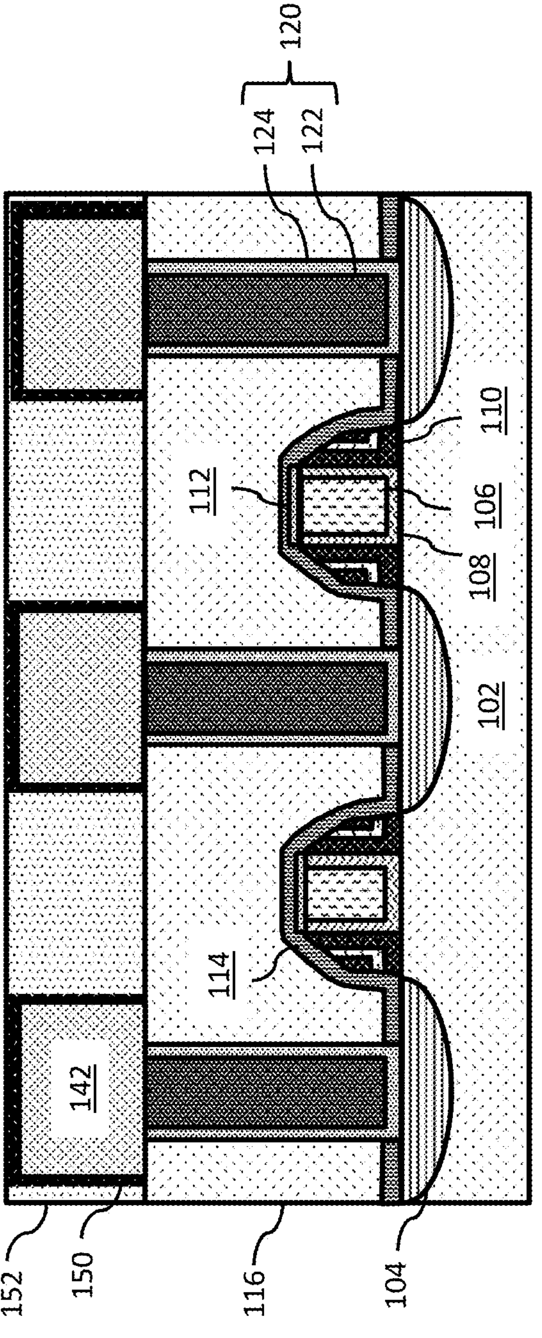

In FIG. 6, an intermetal dielectric (IMD) layer 152 is formed over the protective cap layer 150 and exposed surfaces of the PMD layer 116 to fill gaps between the conductive features 142. In some embodiments, the IMD layer 152 comprises silicon oxide, silicon dioxide, the like, or a combination thereof. However, any suitable dielectric material may be used to form the IMD layer 152. In some embodiments, the IMD layer 152 is formed by depositing tetraethyl orthosilicate (TEOS) with a suitable deposition process (e.g., CVD, PECVD, the like, or a combination thereof) and subsequently oxidizing the deposited TEOS with a suitable oxidation process (e.g., an oxygen, ozone, or steam treatment). However, any suitable method may be used to form the IMD layer 152. Excess portions of the IMD layer 152 may be removed with a planarization such as a CMP that may stop on the protective cap layer 150. The planarization may also remove top portions of the protective cap layer 150.

Figure 7:
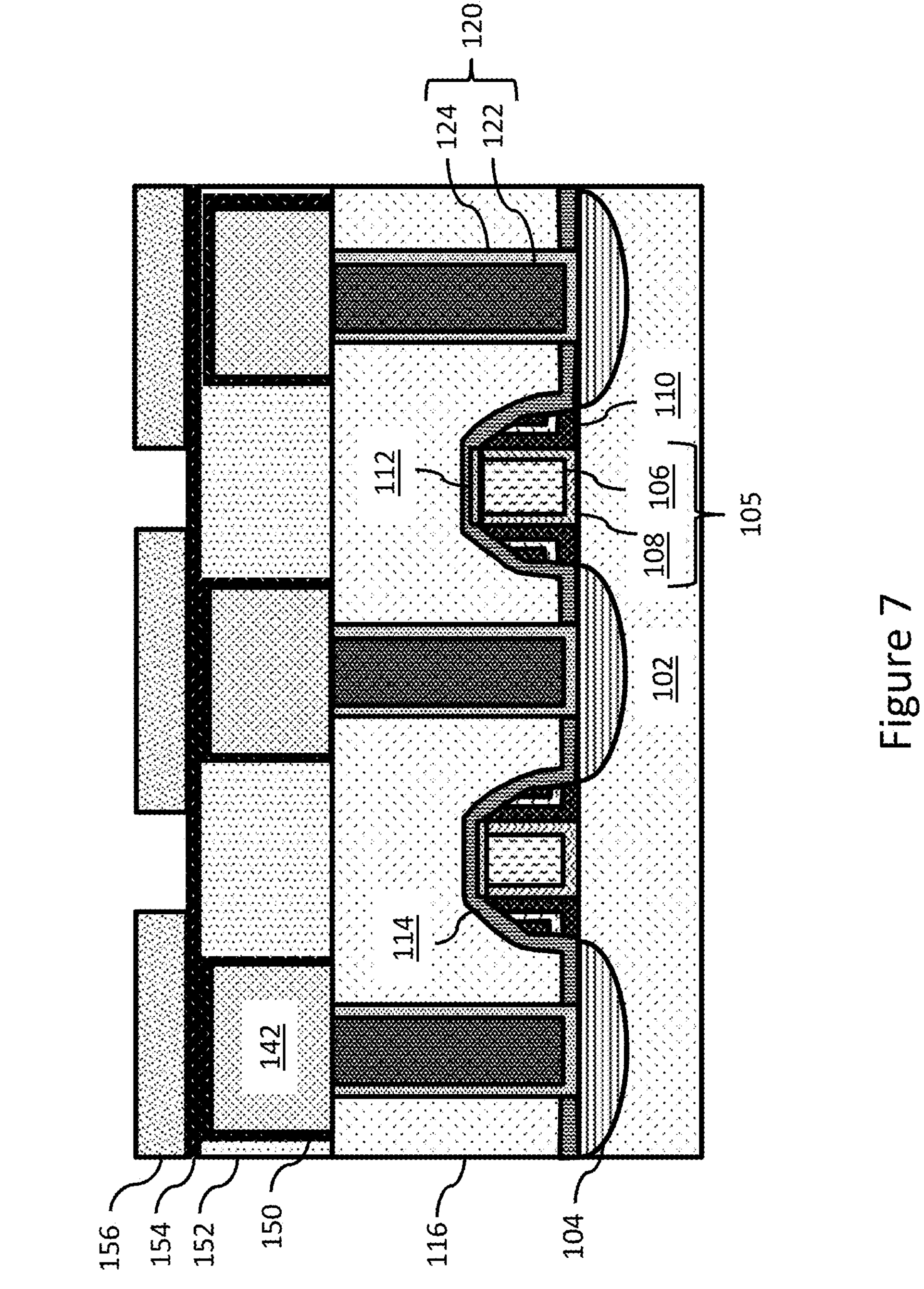

In FIG. 7, a protective layer 154 is formed over the IMD layer 152 and the protective cap layer 150, and a photomask 156 is formed over the protective layer 154. The protective layer 154 may be deposited using similar materials and methods as the protective layer 134 as described above with respect to FIG. 2, and the details are not repeated herein. The photomask 156 is subsequently used to form air gaps in the IMD layer 152 and the PMD layer 116 (see below, FIGS. 8-10). The photomask 156 may be formed and patterned using similar materials and methods as the photomask 136 as described above with respect to FIG. 2, and the details are not repeated herein. Gaps in the photomask 156 may be formed in desirable locations for air gaps, such as over the transistor gate structures 105.

Figure 8:
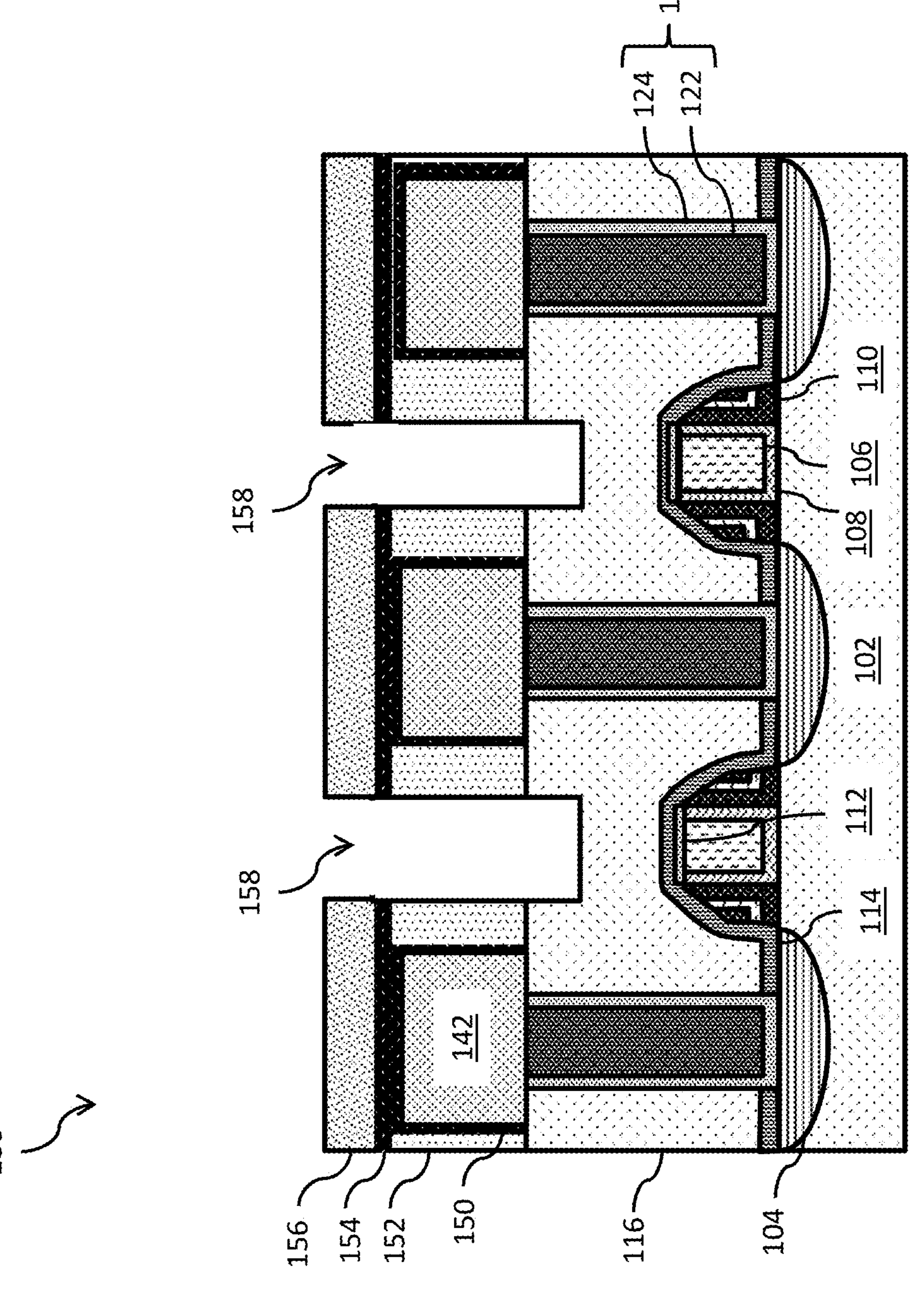

In FIG. 8, holes 158 are etched through the IMD layer 152 and into the PMD layer 116 using the photomask 156 as an etch mask. The holes 158 may be formed with a suitable anisotropic etch process, such as a dry etch (e.g., a plasma process performed with $CF_4$ gas or an RIE process). The holes 158 will subsequently be widened to form air gaps (see below, FIGS. 8-9). The protective cap layer 150 may protect the conductive features 142 during the anisotropic etch process.

Figure 9:
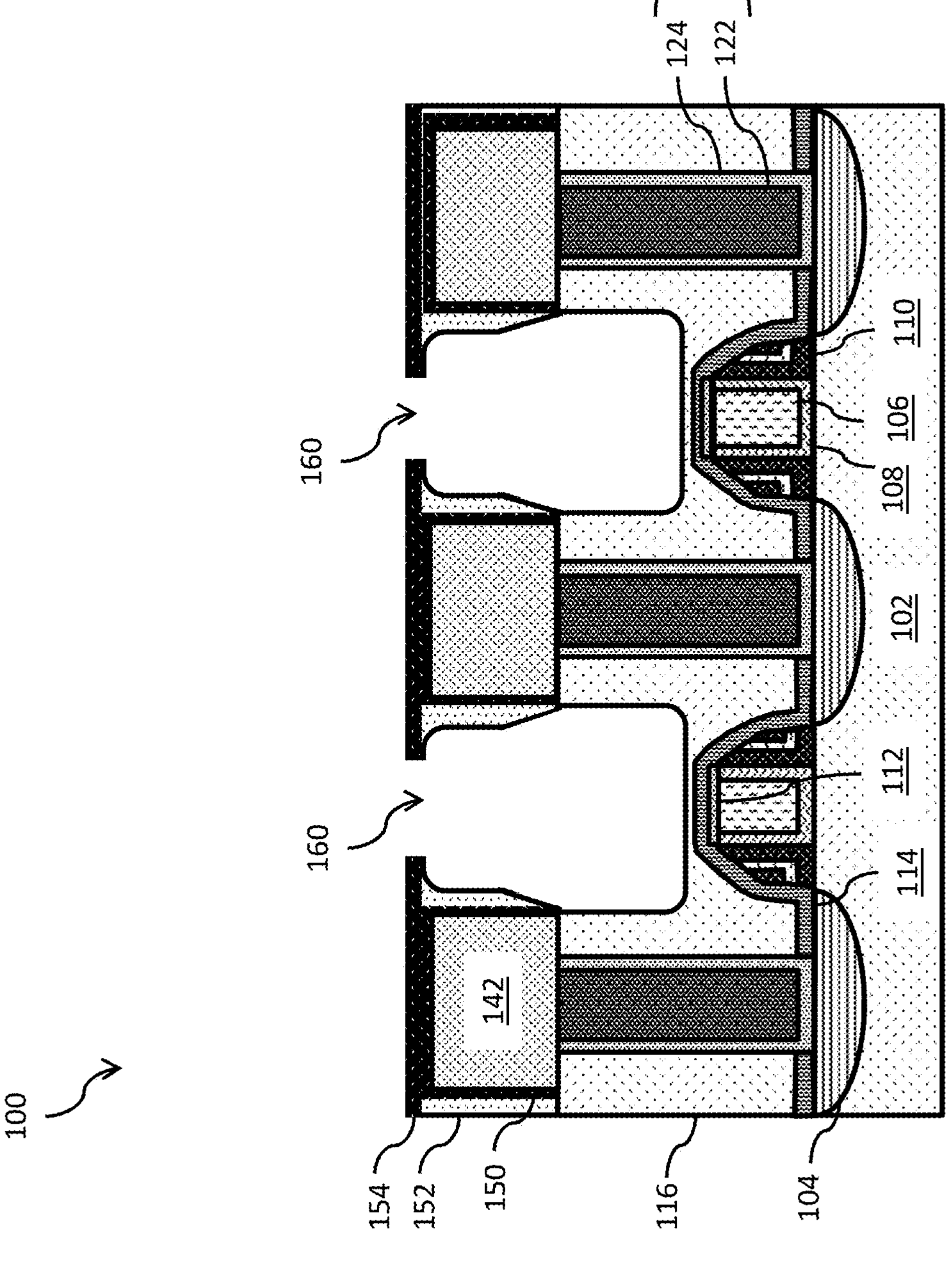

In FIG. 9, the photomask 156 is removed and the holes 158 are widened into spaces 160. The photomask 156 may be removed by a suitable process such as an ashing process. An isotropic etch process is then used to widen the holes 158 into spaces 160. The isotropic etch process may be selective to the material of the IMD layer 152 and the PMD layer 116 over the material of the protective layer 154. In some embodiments, the isotropic etch process is a wet etch performed with HF, HF vapor, HCl, KOH, TMAH, NaOH, BHF, $HNO_3$, BOE (buffered oxide etch) etc. The wet etch chemical(s) may be chosen depending on the surrounding materials, and a mix of more than one chemical may be used. The protective cap layer 150 may protect the conductive features 142 during the isotropic etch process. The removal of the portions of the protective layer 148 over the PMD layer 116 (see above, FIG. 5) may allow for the spaces 160 (and subsequently formed air gaps; see below, FIG. 10) to be wider, which may advantageously increase the dielectric constant of the PMD layer 116 and the IMD layer 152.

Figure 10:
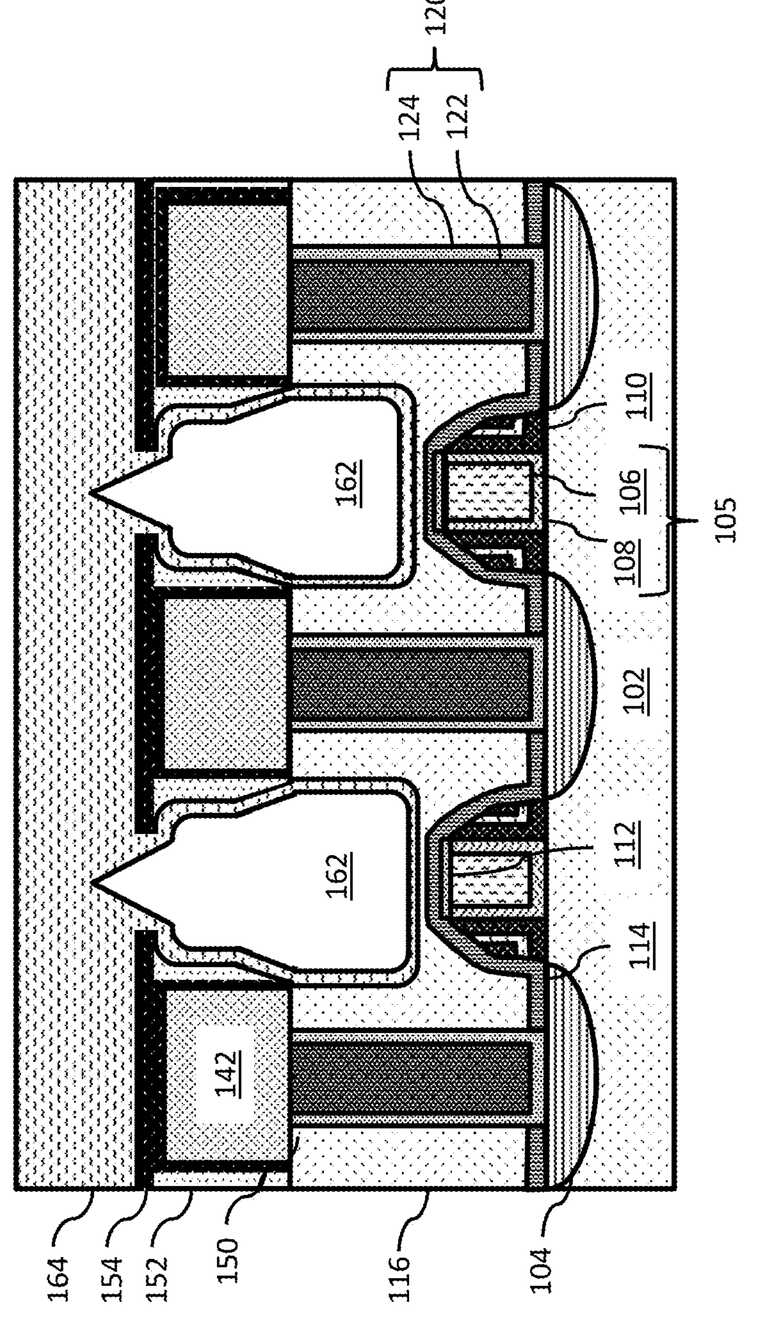

In FIG. 10, an IMD layer 164 is formed over the protective layer 154 and exposed surfaces of the spaces 160 to form air gaps 162. The IMD layer 164 may be formed using similar materials and methods as the IMD layer 152 as described above with respect to FIG. 6, and the details are not repeated herein. The IMD layer 164 seals the air gaps 162, and material of the IMD layer 164 may cover inner surfaces of the air gaps 162. The air gaps 162 comprise an ambient, such as residual gas present in the process chamber (e.g., from a PECVD process used to form the IMD layer 164). In some embodiments, the air gaps 162 are above the transistor gate structures 105 and have a greater width than a combined width of a transistor gate structure 105 and neighboring gate spacers 110. Seams at the tops of the air gaps 162 may extend through gaps in the protective layer 154 into the IMD layer 164.

FIGS. 11-18 illustrate cross-sectional views of intermediate steps in another subtractive process for forming conductive features (e.g., metal lines) protected by a protective cap layer and for forming air gaps between and/or adjacent to the conductive features, in accordance with some embodiments. Although the structures of FIGS. 11-18 are formed using the example semiconductor structure 100 of FIG. 1, the structures of FIGS. 11-18 may be formed using any suitable semiconductor structure or substrate, and any such structures are within the scope of the disclosed embodiments.

Figure 11:
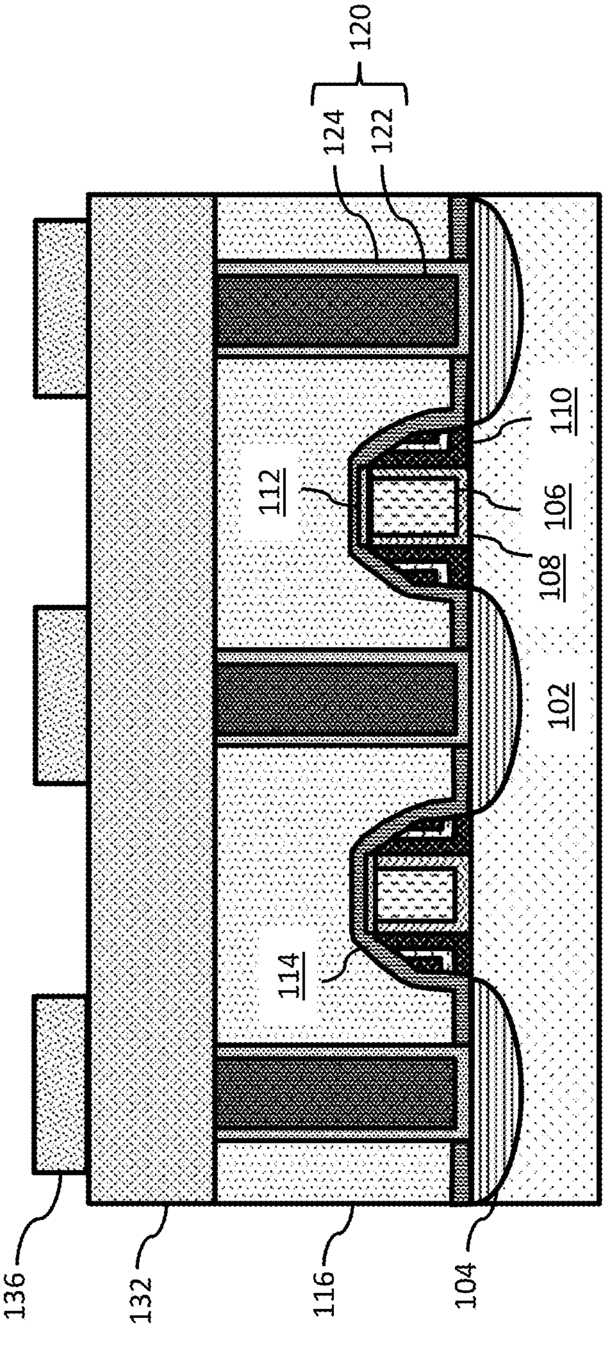
FIGS. 11-18 illustrate cross-sectional views of intermediate steps in another semiconductor manufacturing process, in accordance with some embodiments.

In FIG. 11, following from FIG. 1, a conductive layer 132 is formed over the PMD layer 116 and the contacts 120 and a photomask 136 is formed and patterned over the conductive layer 132. The conductive layer 132 and the photomask 136 may be formed using similar materials and methods as described above with respect to FIG. 2, and the details are not repeated herein. In some embodiments, the conductive layer 132 comprises aluminum.

Figure 12:
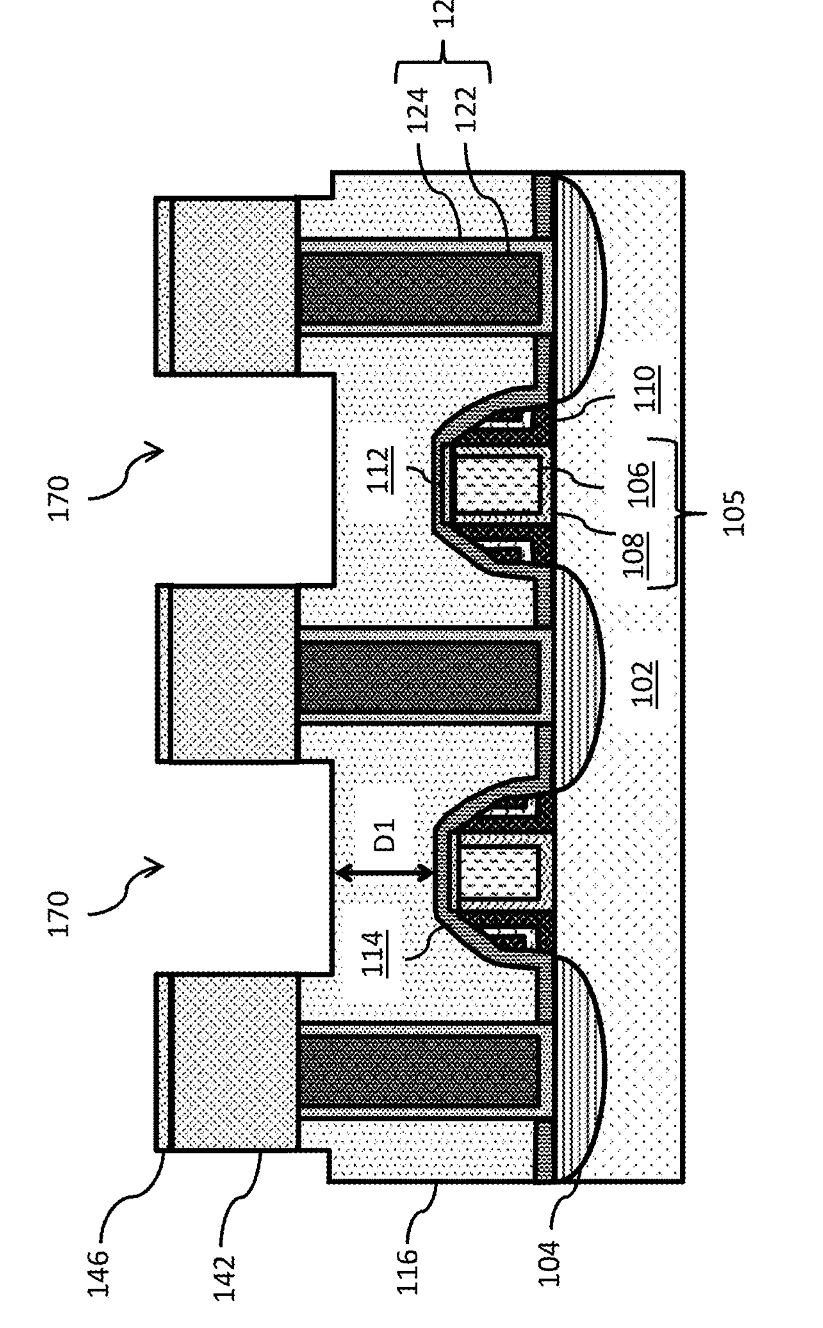

In FIG. 12, the photomask 136 is used as an etching mask to pattern the conductive layer 132 with an etch process. The etch process to form conductive features 142 may use similar methods as described above with respect to FIG. 3, and the details are not repeated herein. An etched photomask 146 may remain over the conductive features 142. In some embodiments, openings 170 between the conductive features 142 extend into the PMD layer 116 below a bottom surface of the conductive features 142. For example, the bottom surfaces of the openings 170 may be above the transistor gate structures 105 by a first distance D1 in a range of 0 nm to 500 nm, depending on the technological node and the thickness of the PMD layer 116. For example, the openings 170 may extend through up to 95% of the thickness of the PMD layer 116.

Figure 13:
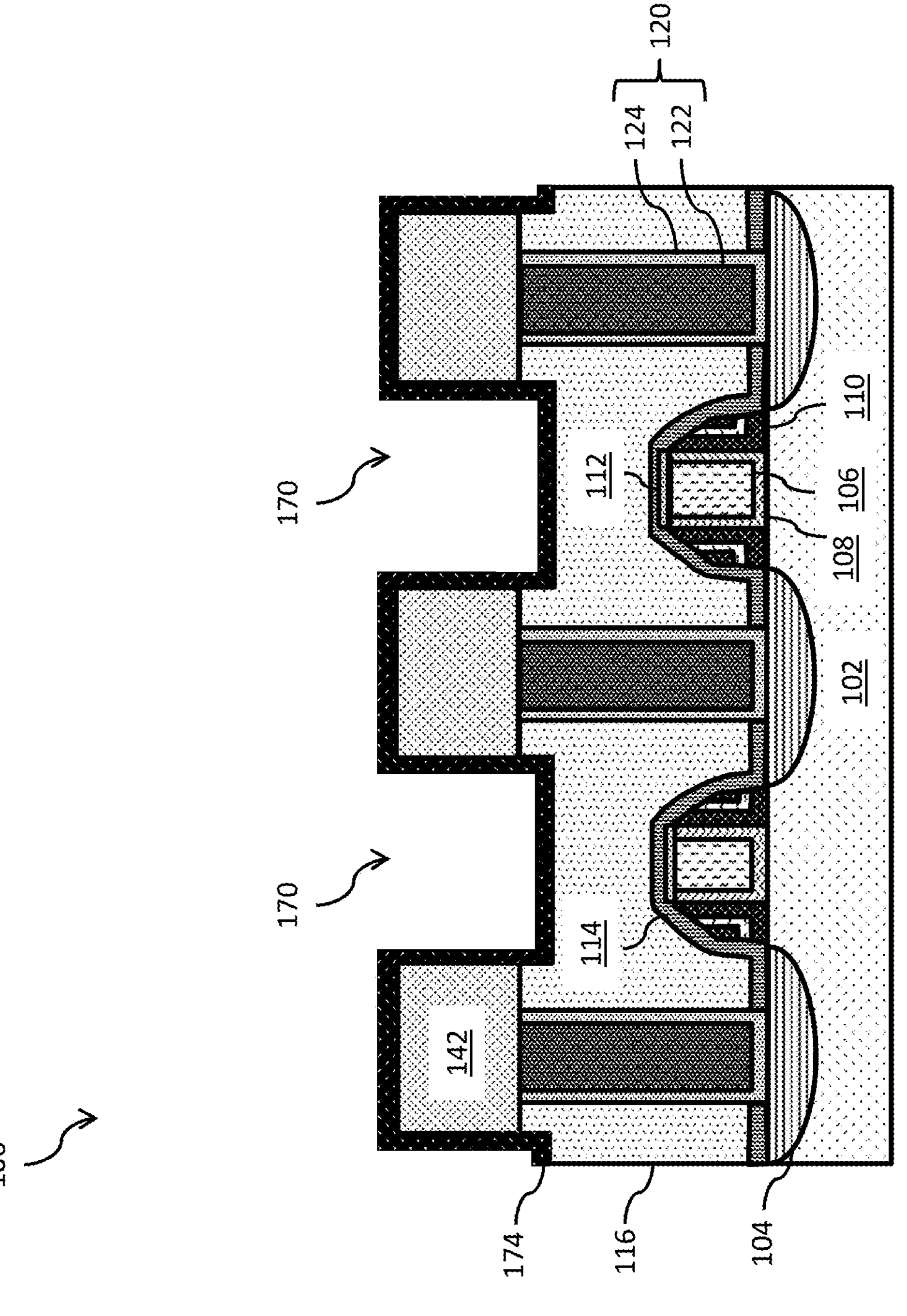

Next, in FIG. 13, the etched photomask 146 (if present) is removed and a protective cap layer 174 is formed over the conductive features 142 and the PMD layer 116. The protective cap layer 174 covers top surfaces and sidewalls of the conductive features 142 and exposed surfaces of the PMD layer 116. The protective cap layer 174 may be formed using similar materials and methods as the protective layer 134 as described above with respect to FIG. 2, and the details are not repeated herein. The protective cap layer 174 may protect the underlying conductive features 142 during subsequent manufacturing processes, such as the etching of air gaps (see below, FIGS. 16-18). In some embodiments, the protective cap layer 174 has a square wave profile in a cross-sectional view.

Figure 14:
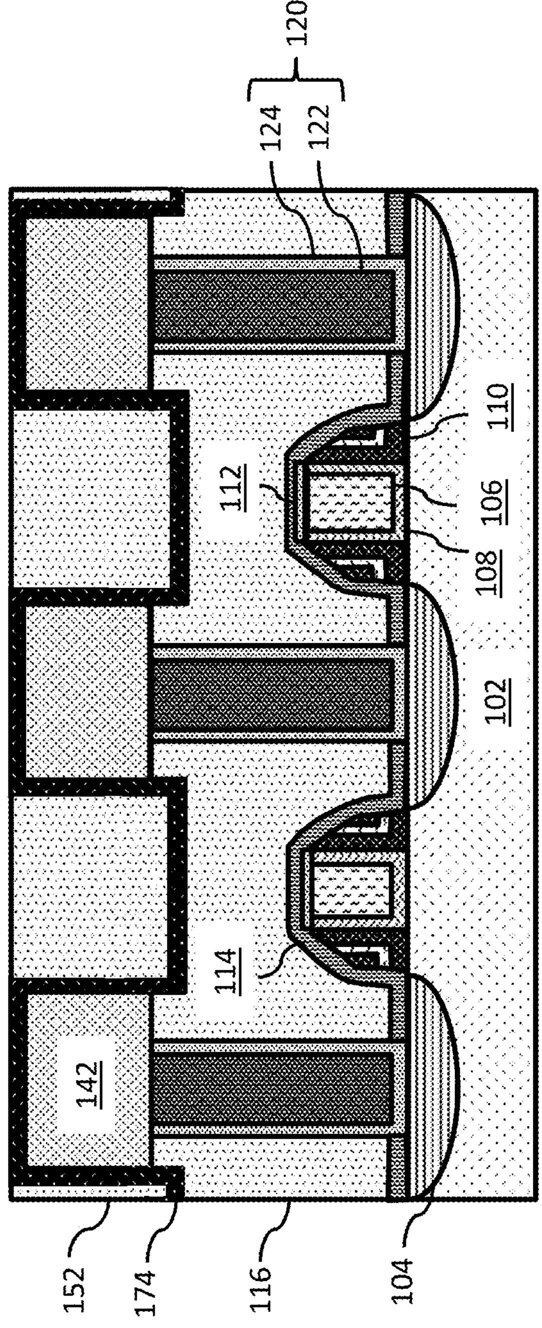

In FIG. 14, an IMD layer 152 is formed over the protective cap layer 174 and exposed surfaces of the PMD layer 116 to fill the openings 170 between the conductive features 142. The IMD layer 152 may be formed using similar materials and methods as described above with respect to FIG. 6, and the details are not repeated herein. Excess portions of the IMD layer 152 may be removed with a planarization such as a CMP that may stop on the protective cap layer 174, such as by mechanical resistance of the protective cap layer 174 to the CMP. The planarization may also remove top portions of the protective cap layer 174.

Figure 15:
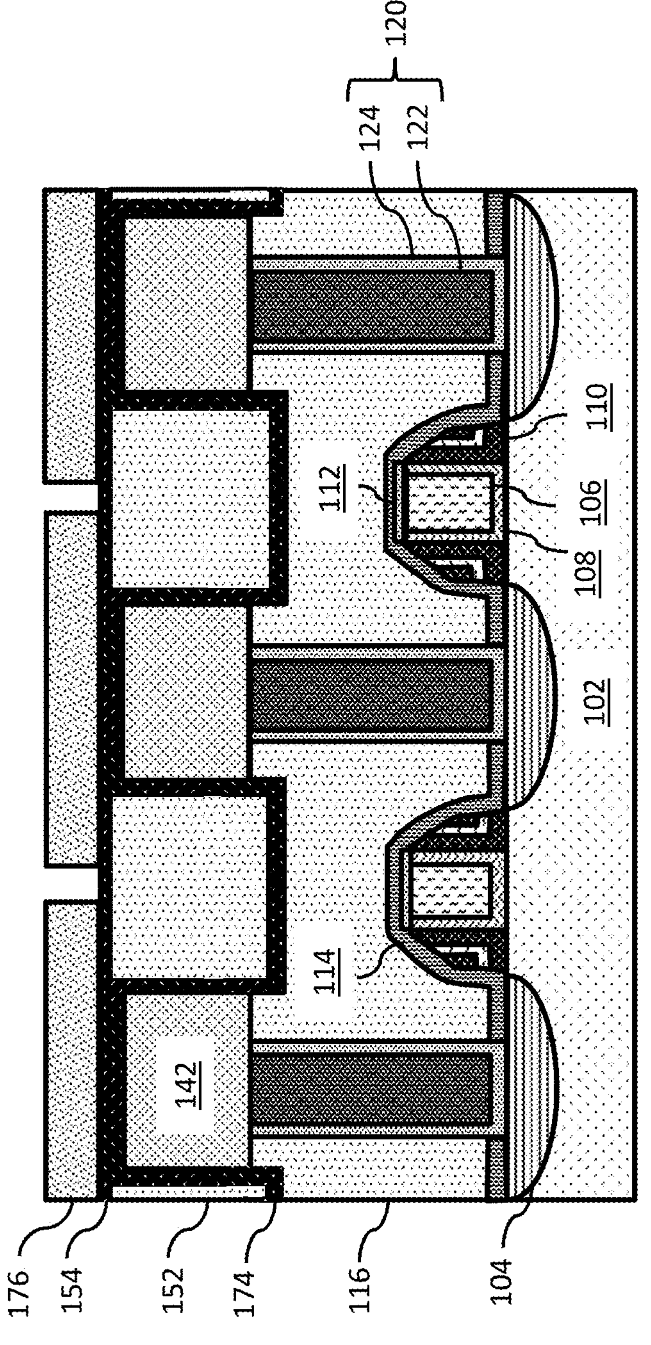

Next, in FIG. 15, a protective layer 154 is formed over the IMD layer 152 and the protective cap layer 174, and a photomask 176 is formed over the protective layer 154. The protective layer 154 may be deposited using similar materials and methods as the protective layer 134 as described above with respect to FIG. 2, and the details are not repeated herein. The photomask 176 is subsequently used to form air gaps in the IMD layer 152 and the PMD layer 116 (see below, FIGS. 16-18). The photomask 176 may be formed and patterned using similar materials and methods as the photomask 136 as described above with respect to FIG. 2, and the details are not repeated herein. Gaps in the photomask 176 may be formed in desirable locations for air gaps, such as over the transistor gate structures 105.

Figure 16:
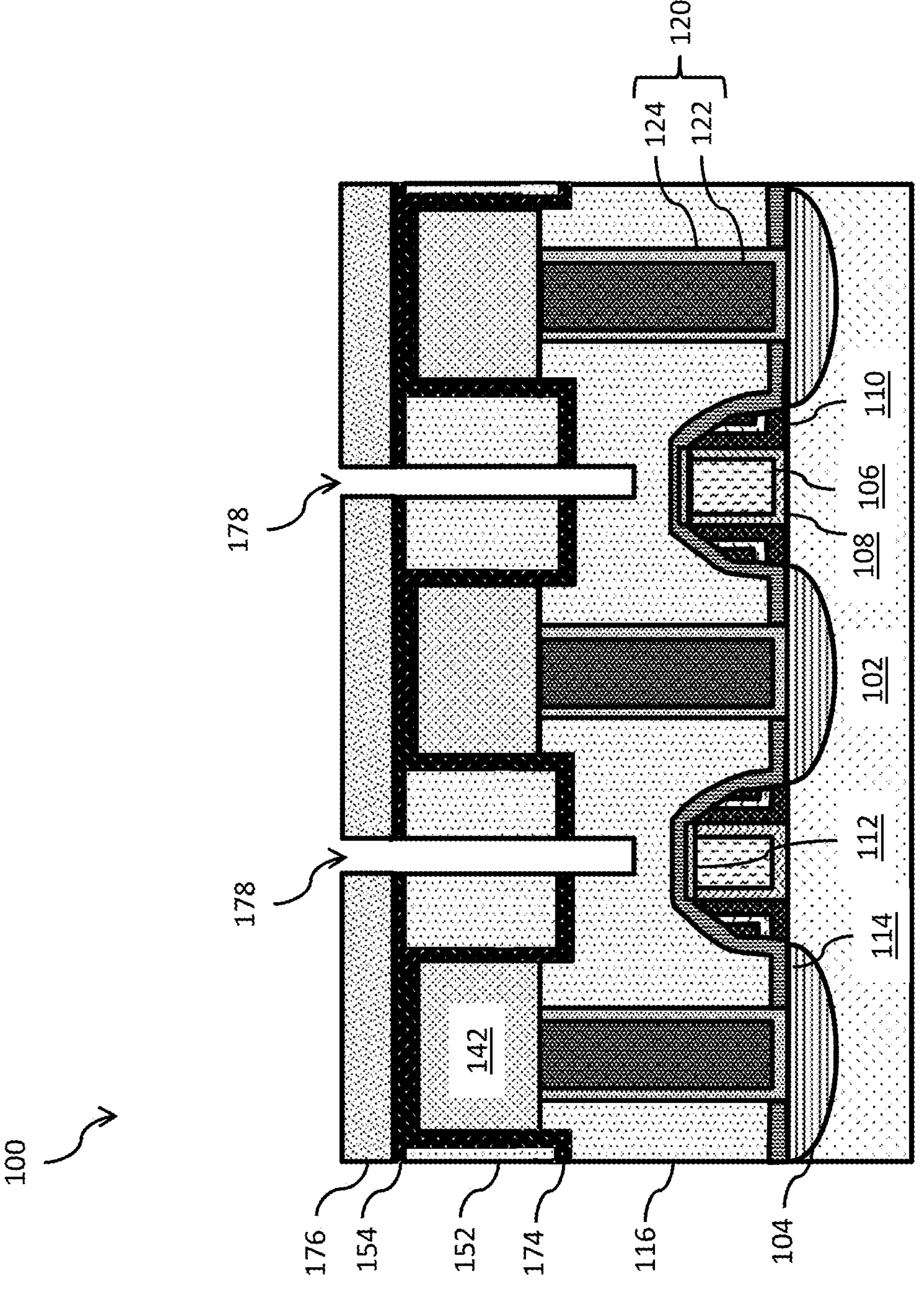

In FIG. 16, holes 178 are etched through the protective layer 154, the IMD layer 152, the protective cap layer 174, and into the PMD layer 116 using the photomask 176 as an etch mask. The holes 178 may be formed with an anisotropic etch process, such as a dry etch (e.g., a plasma process performed with $CF_4$ gas or an RIE process). In some embodiments, the anisotropic etch process comprises more than one etch step. For example, a first dry etch that is selective to protective material may be used to etch through the protective layer 154, a second dry etch that is selective to oxide material may be used to etch through the IMD layer 152, and a third dry etch that is selective to protective material may be used to etch through the protective cap layer 174. However, any suitable combination of etch processes may be used. The holes 178 may have smaller widths than the holes 158 due to the presence of the protective cap layer 174. The holes 178 will subsequently be widened to form air gaps (see below, FIGS. 17-18). The protective cap layer 174 may protect the conductive features 142 during the anisotropic etch process.

Figure 17:
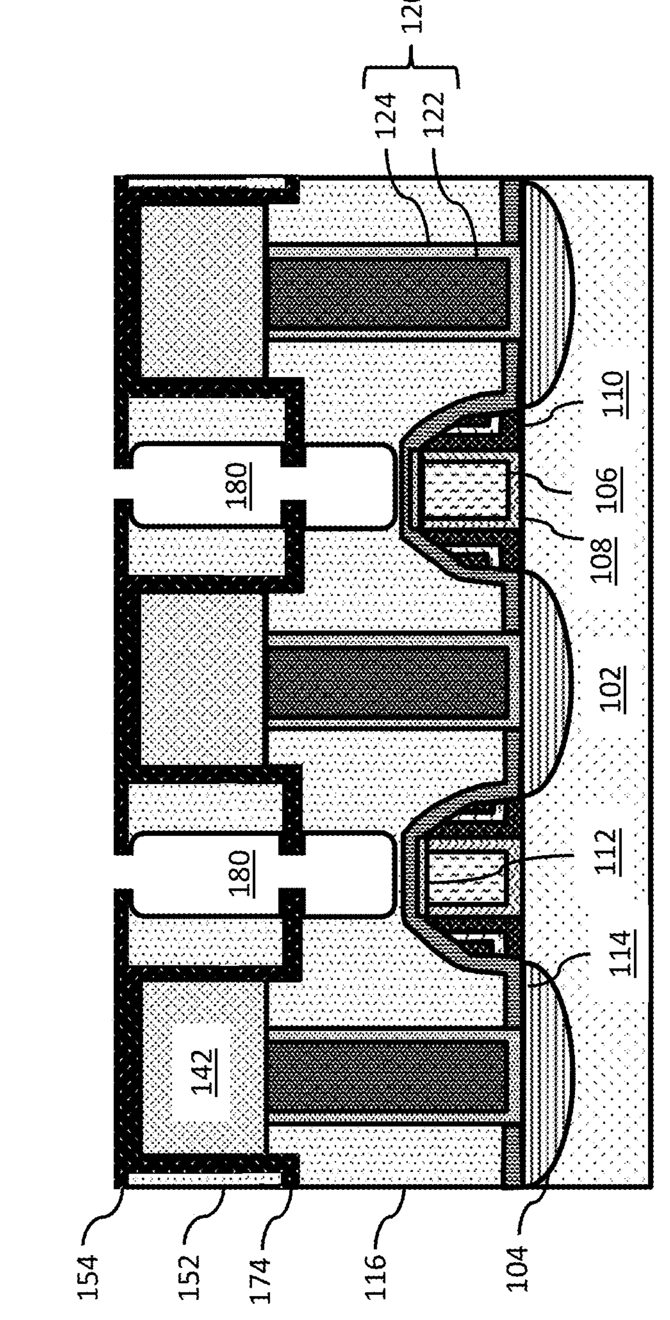

Next, in FIG. 17, the photomask 176 is removed and the holes 178 are widened into spaces 180. The photomask 176 may be removed by a suitable process such as an ashing process. An isotropic etch process is then used to widen the holes 178 into spaces 180. The isotropic etch process may be performed using similar methods and reactants as the isotropic etch process described above with respect to FIG. 9, and the details are not repeated herein. The protective cap layer 174 may protect the conductive features 142 during the isotropic etch process.

Figure 18:
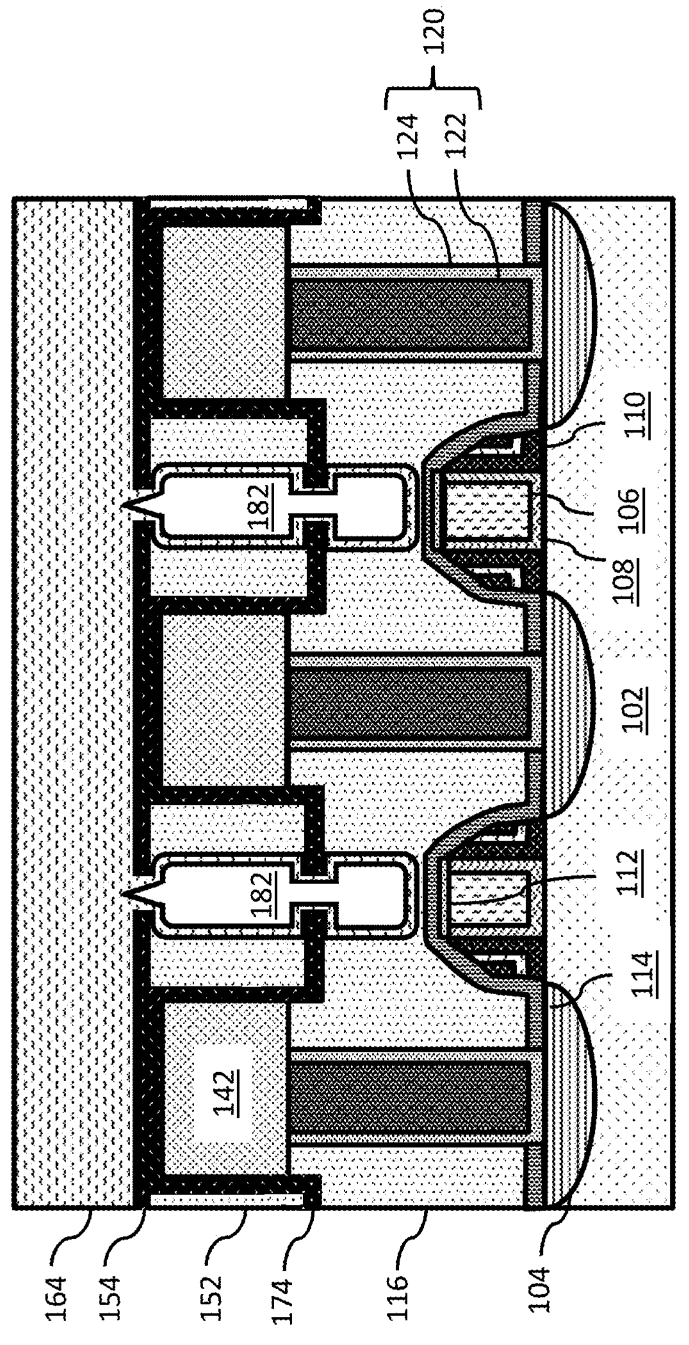

In FIG. 18, an IMD layer 164 is formed over the protective layer 154 and exposed surfaces of the spaces 180 to form air gaps 182. The IMD layer 164 may be formed using similar materials and methods as the IMD layer 152 as described above with respect to FIG. 6, and the details are not repeated herein. The IMD layer 164 seals the air gaps 182, and material of the IMD layer 164 may cover inner surfaces of the air gaps 182. In some embodiments, the air gaps 182 are above the transistor gate structures 105 and have a smaller width than a combined width of a transistor gate structure 105 and neighboring gate spacers 110. Seams at the tops of the air gaps 182 may extend through gaps in the protective layer 154 into the IMD layer 164.

FIGS. 19-26 illustrate cross-sectional views of intermediate steps in a damascene process for forming conductive features (e.g., metal lines) protected by a protective cap layer and for forming air gaps between and/or adjacent to the conductive features, in accordance with some embodiments. Although the structures of FIGS. 19-26 are formed using the example semiconductor structure 100 of FIG. 1, the structures of FIGS. 19-26 may be formed using any suitable semiconductor structure or substrate, and any such structures are within the scope of the disclosed embodiments.

Figure 19:
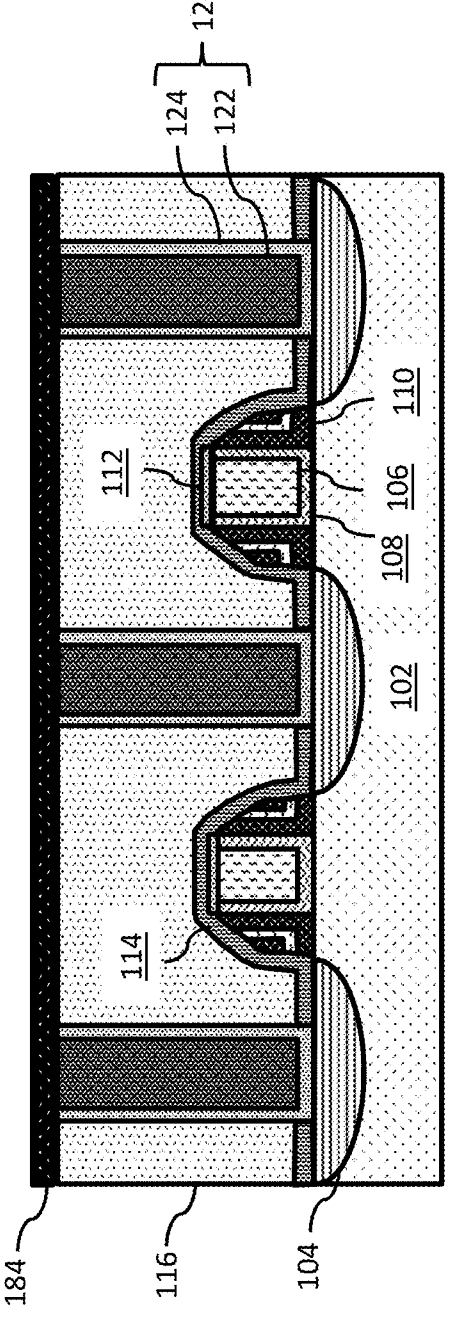
FIGS. 19-26 illustrate cross-sectional views of intermediate steps in another semiconductor manufacturing process, in accordance with some embodiments.
Figure 19:
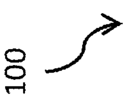

In FIG. 19, following from FIG. 1, a protective layer 184 is formed over the PMD layer 116 and the contacts 120. The protective layer 184 may be formed with similar materials and methods as the protective layer 134 as described above with respect to FIG. 2.

Figure 20:
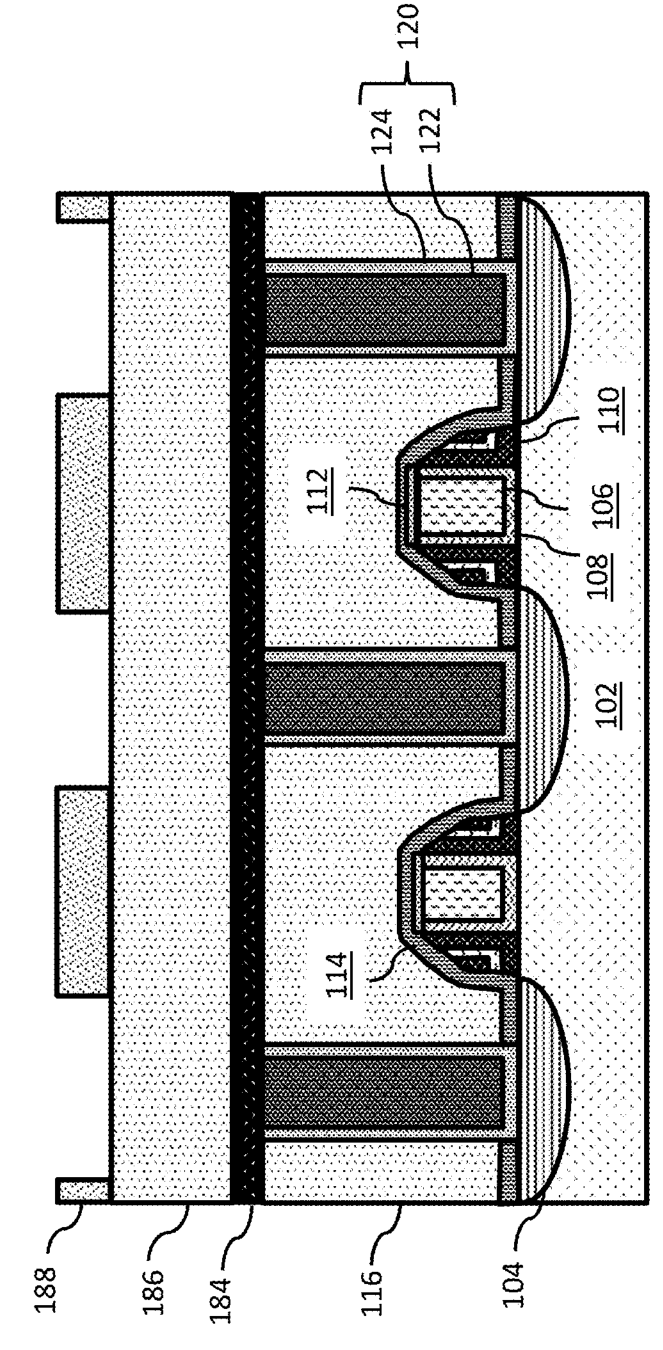

Next, in FIG. 20, an IMD layer 186 is formed over the protective layer 184 and a photomask 188 is formed and patterned over the protective layer 134. The IMD layer 186 may be formed with similar materials and methods as the IMD layer 152 as described above with respect to FIG. 6. The photomask 188 is used to subsequently pattern the IMD layer 186 in order to form conductive features (e.g., metal lines).

Figure 21:
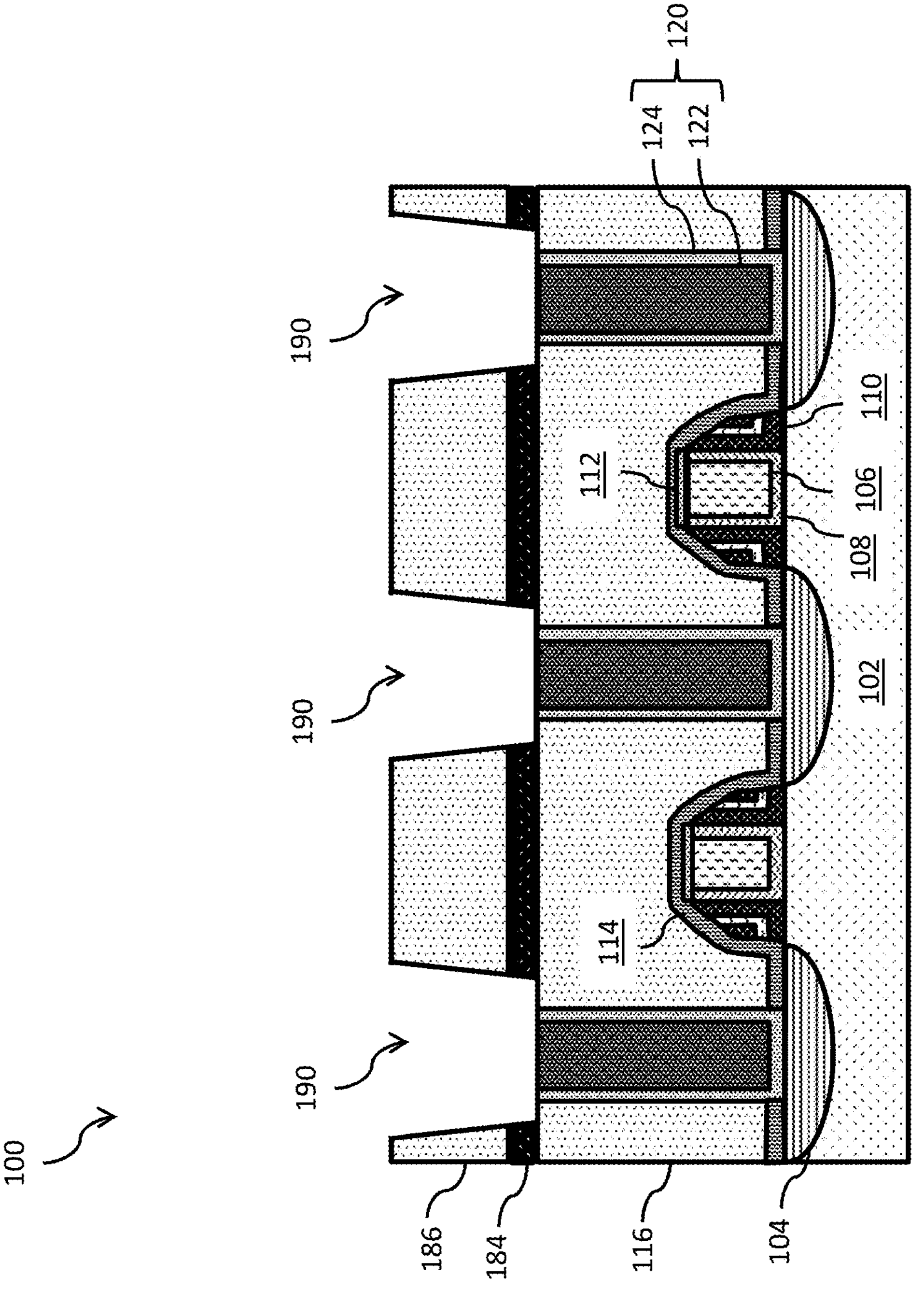

In FIG. 21, openings 190 are etched through the IMD layer 186 and the protective layer 184 to expose top surfaces of the contacts 120. The openings 190 may be formed with one or more anisotropic etch processes (e.g., dry etches). For example, a first dry etch selective to oxide material may be used to etch through the IMD layer 186 and a second dry etch selective to protective material may be used to etch through the protective layer 184. However, any suitable method may be used to form the openings 190. After forming the openings 190, the photomask 188 may be removed with a suitable process (e.g., an ashing process).

Figure 22:
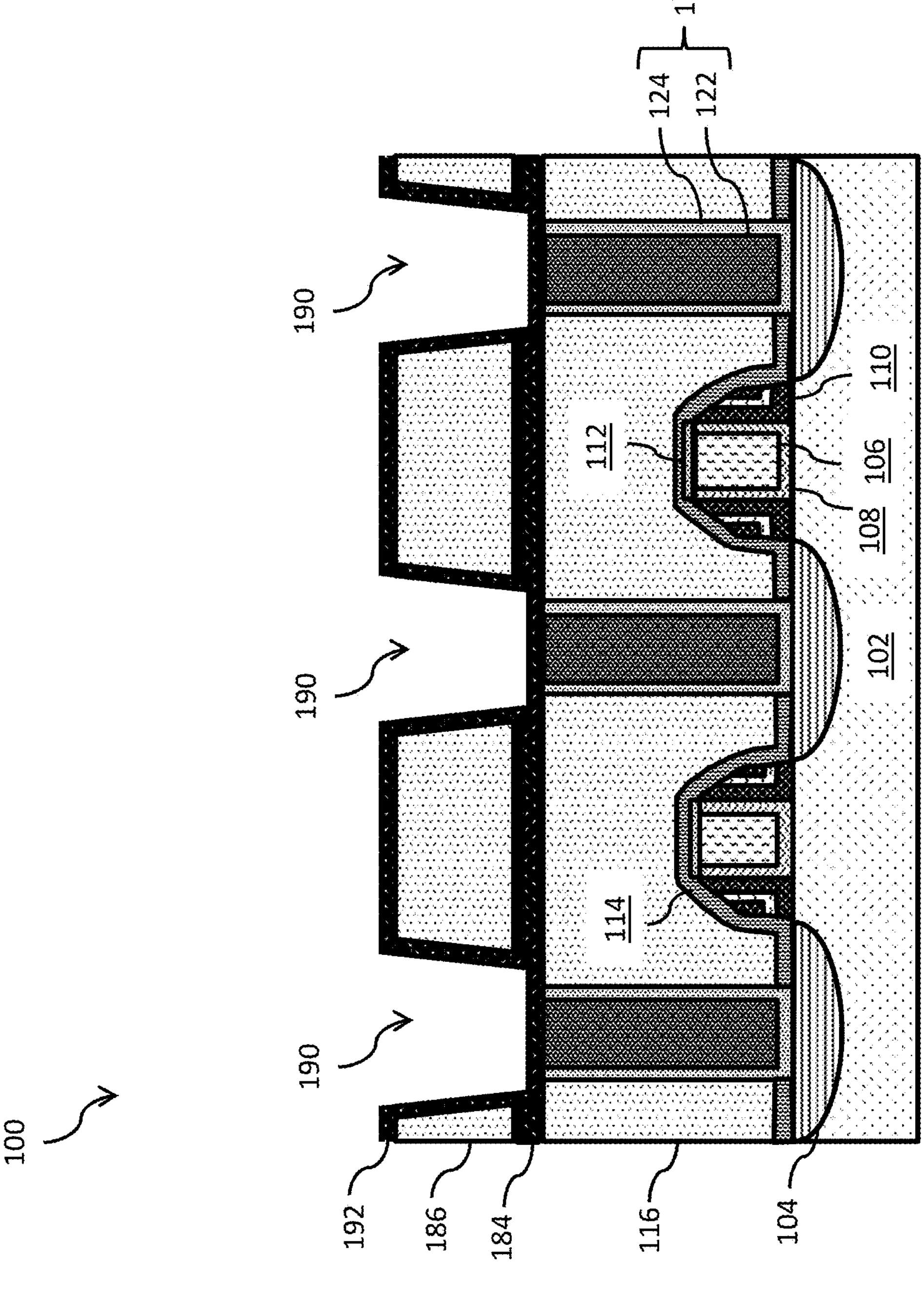

Next, in FIG. 22, a protective layer 192 is formed over the IMD layer 186 and exposed surfaces of the contacts 120. The protective layer 192 may be formed using similar materials and methods as the protective layer 134 as described above with respect to FIG. 2, and the details are not repeated herein.

Figure 23:
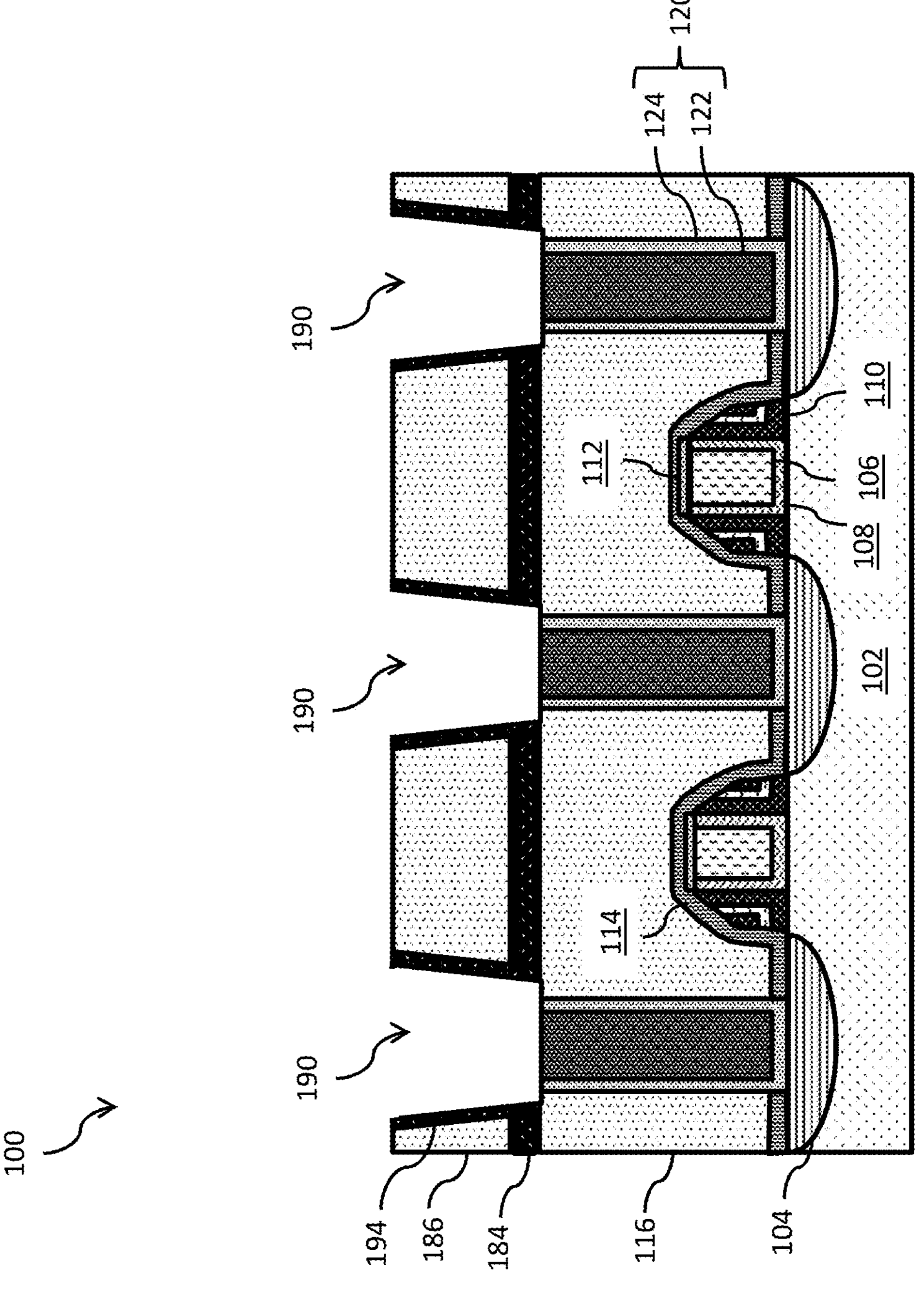

In FIG. 23, portions of the protective layer 192 over the IMD layer 186 and top surfaces of the contacts 120 are removed to form a protection layer 194. The portions of the protective layer 192 over the IMD layer 186 and top surfaces of the contacts 120 may be removed with a suitable process such as an anisotropic etching process (e.g., a plasma process performed with $CF_4$ gas or a RIE process). The remaining portions of the protective layer 192 form a protection layer 194 that covers sidewalls of the openings 190. The protection layer 194 may be advantageous for protecting subsequently formed conductive features (see below, FIGS. 24-25) during subsequent manufacturing processes, such as the etching of air gaps (see below, FIG. 26).

Figure 24:
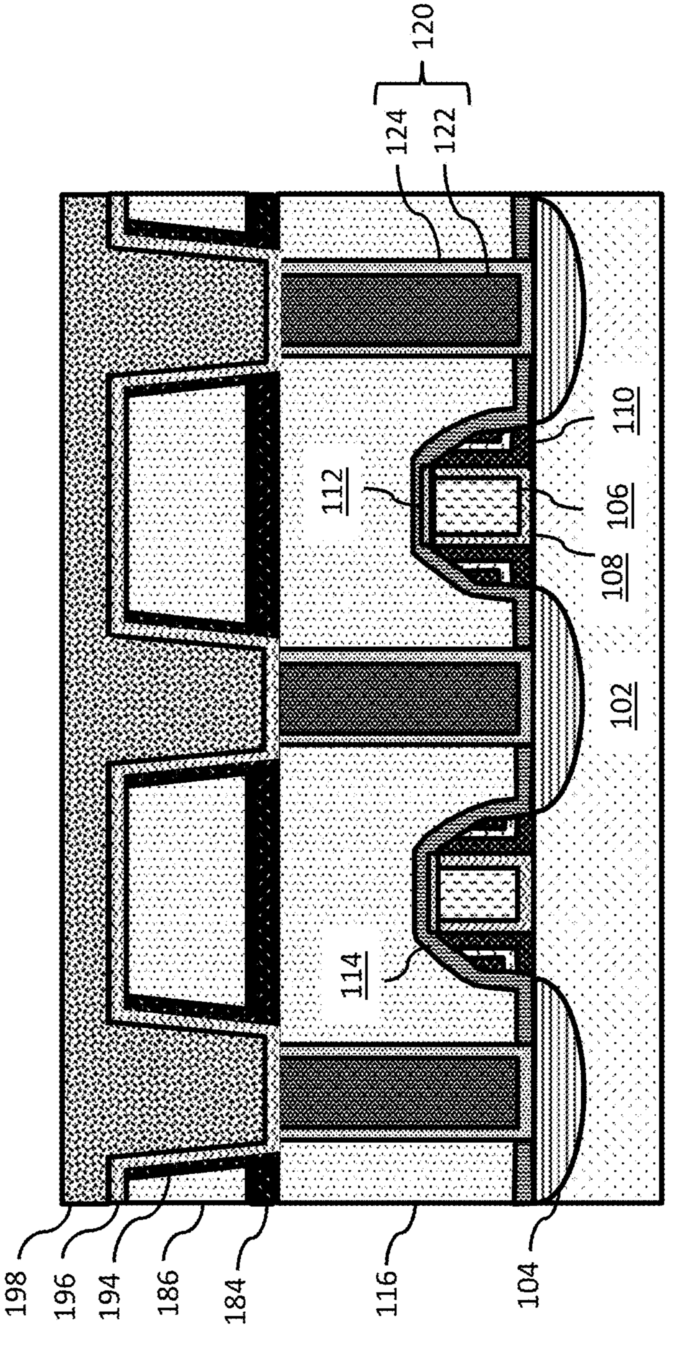

In FIG. 24, a barrier layer 196 is formed over the exposed surfaces of the openings 190 and the IMD layer 186, and a conductive fill material 198 is formed over the barrier layer 196 to fill the openings 190. The barrier layer 196 comprises a suitable conductive material such as tantalum, tantalum nitride, titanium, titanium nitride, the like, or a combination thereof. In some embodiments, the barrier layer 196 comprises tantalum or tantalum nitride. The barrier layer 196 is formed with a suitable method such as CVD, PVD, ALD, electroplating, or the like. The conductive fill material 198 is then formed over the barrier layer 196 to fill the openings. The conductive fill material 198 comprises a suitable conductive material such as copper, tungsten, cobalt, copper, tin, gold, silver, aluminum, the like, or a combination thereof. In some embodiments, the conductive fill material 198 comprises copper. The conductive fill material is formed with a suitable method such as electroplating, CVD, PVD, ALD, or the like.

Figure 25:
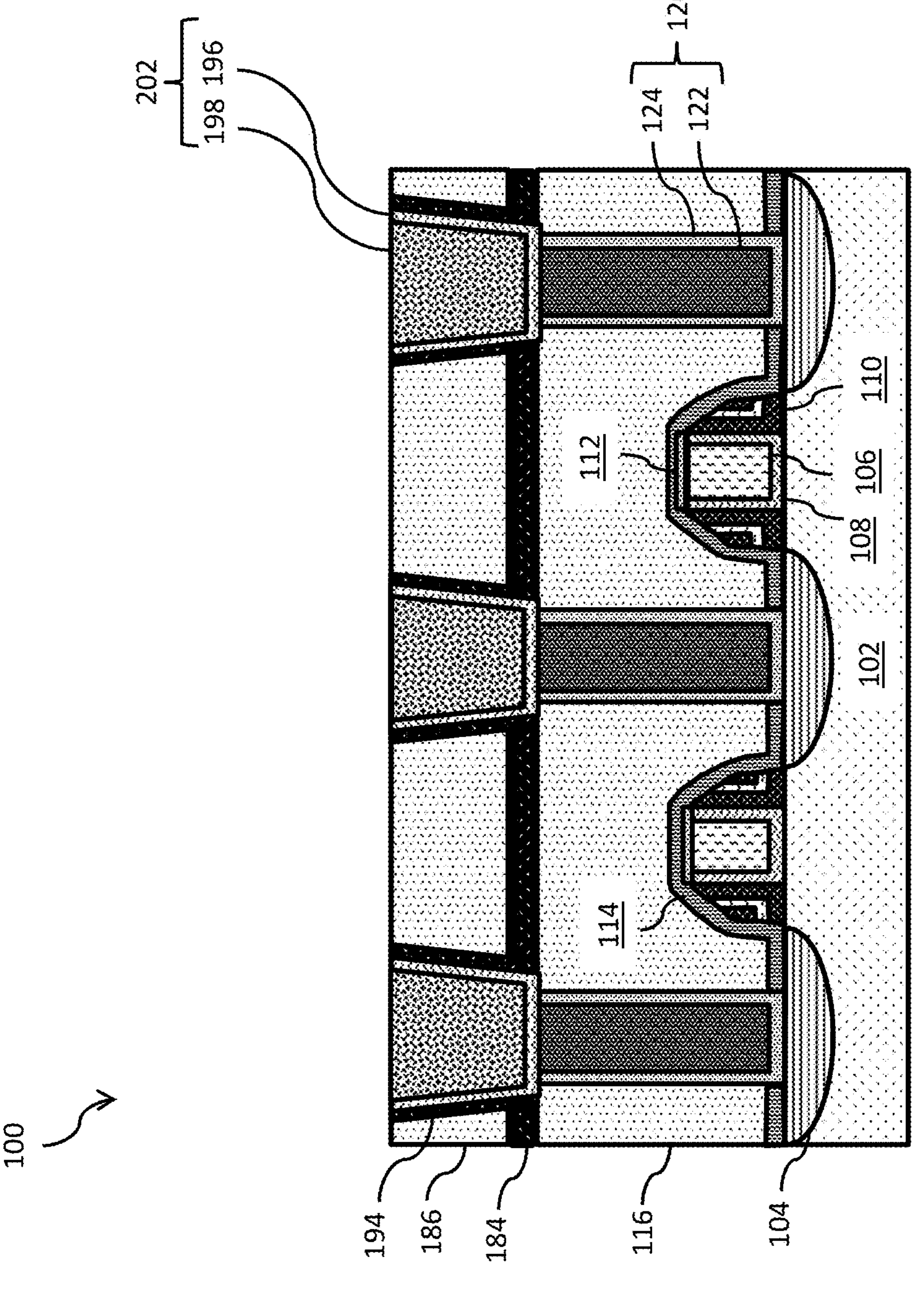

Next, in FIG. 25, top portions of the barrier layer 196 and the conductive fill material 198 are removed with a suitable planarization process, such as a chemical mechanical polish (CMP). The remaining portions of the conductive fill material 198 and the barrier layer 196 form conductive features 202 (e.g., metal lines). In some embodiments, sidewalls of the conductive features 202 are covered by the protection layer 194.

Figure 26:
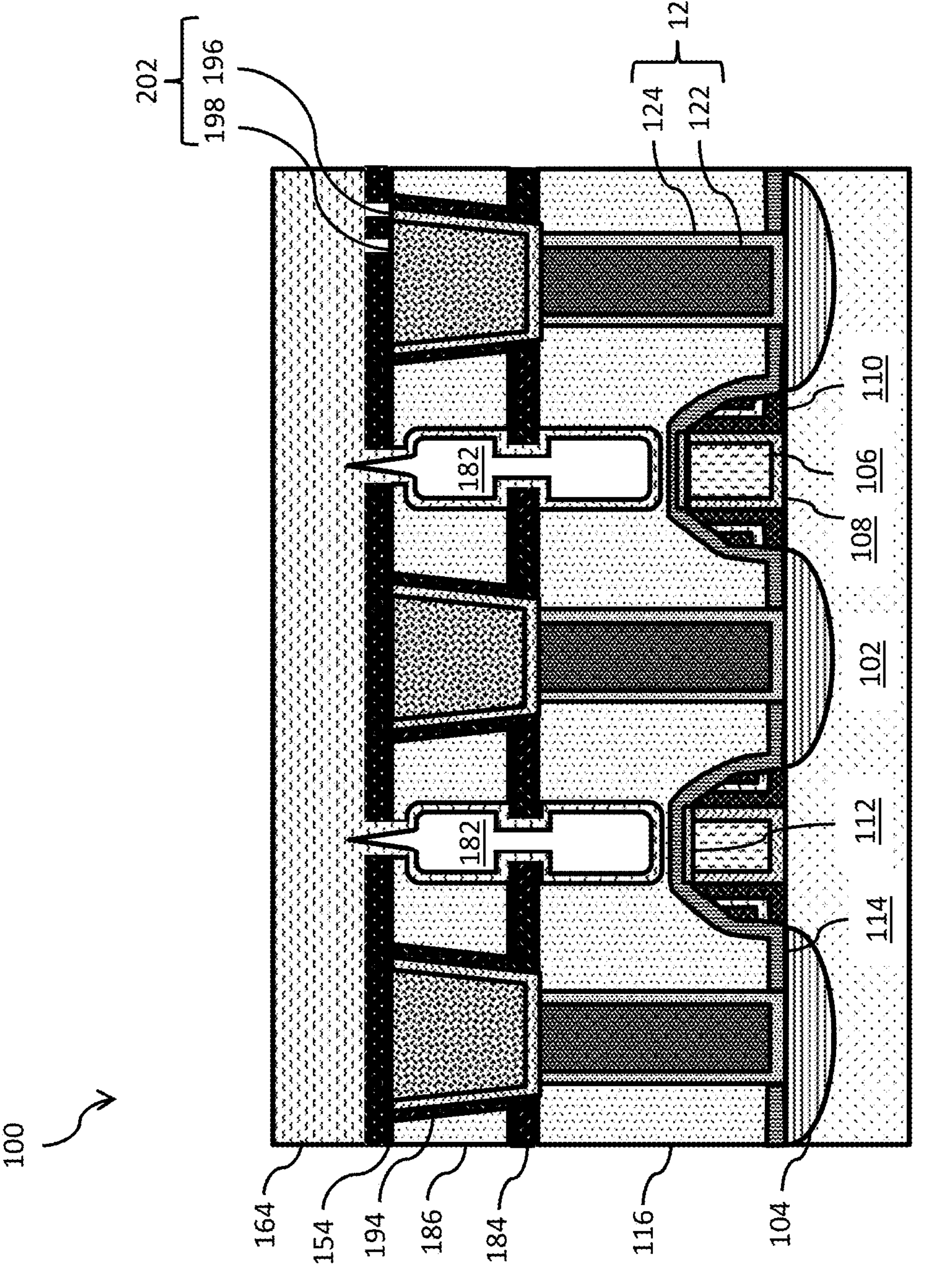

In FIG. 26, a protective layer 154 is formed over the conductive features 202 and the IMD layer 186. The protective layer 154 may be formed using similar materials and methods as the protective layer 134 as described above with respect to FIG. 2, and the details are not repeated herein. Next, air gaps 182 are formed in the PMD layer 116 and the IMD layer 186 and an IMD layer 164 is formed over the protective layer 154. The air gaps 182 and the IMD layer 164 may be formed using similar materials and methods as described above with respect to FIGS. 15-18, and the details are not repeated herein.

FIGS. 27-35 illustrate cross-sectional views of intermediate steps in a process for forming air gaps between and/or adjacent to conductive features under protective layers with umbrella shaped profiles, in accordance with some embodiments. The umbrella shaped profile of the protective layers may reduce the heights of seams at the tops of the air gaps and thereby reduce the probability that the seams could reopen during subsequent processes. This is advantageous for improving device structure in subsequent manufacturing steps (e.g., forming additional conductive features or intermetal dielectric layers). Although the structures of FIGS. 27-35 are formed using the example semiconductor structure 100 of FIG. 5, the structures of FIGS. 27-35 may be formed using any suitable semiconductor structure or substrate, and any such structures are within the scope of the disclosed embodiments.

Figure 27:
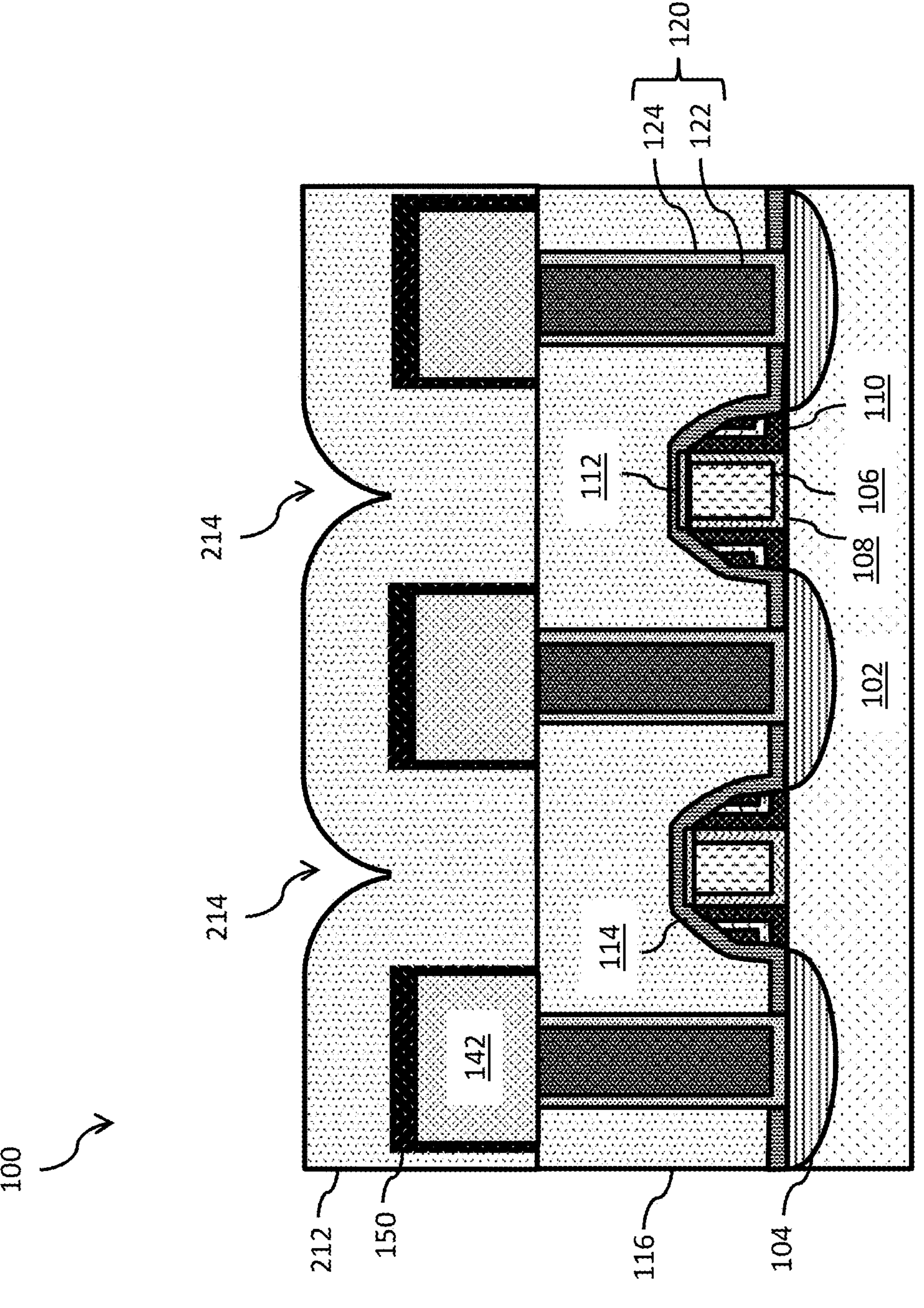
FIGS. 27-35 illustrate cross-sectional views of intermediate steps in another semiconductor manufacturing process, in accordance with some embodiments.

FIG. 27 follows from FIG. 5 and illustrates an IMD layer 212 formed over the conductive features 142 (e.g., metal lines), protective cap layer 150, and PMD layer 116. Although in the example of FIG. 27 the conductive features 142 are illustrated as having top surfaces and sidewalls covered by the protective cap layer 150, in some embodiments only the sidewalls of the conductive features 142 are covered by the protective cap layer 150 and top surfaces of the conductive features 142 are exposed. In other embodiments, the protective cap layer 150 is not present.

The IMD layer 212 may be formed using similar methods and materials as the IMD layer 152 as described above with respect to FIG. 6, and the details are not repeated herein. Dents 214 are present in the top surface of the IMD layer 212 between adjacent conductive features 142. The dents 214 may be produced due to conformal deposition of the IMD layer 212 over the conductive features 142.

Figure 28:
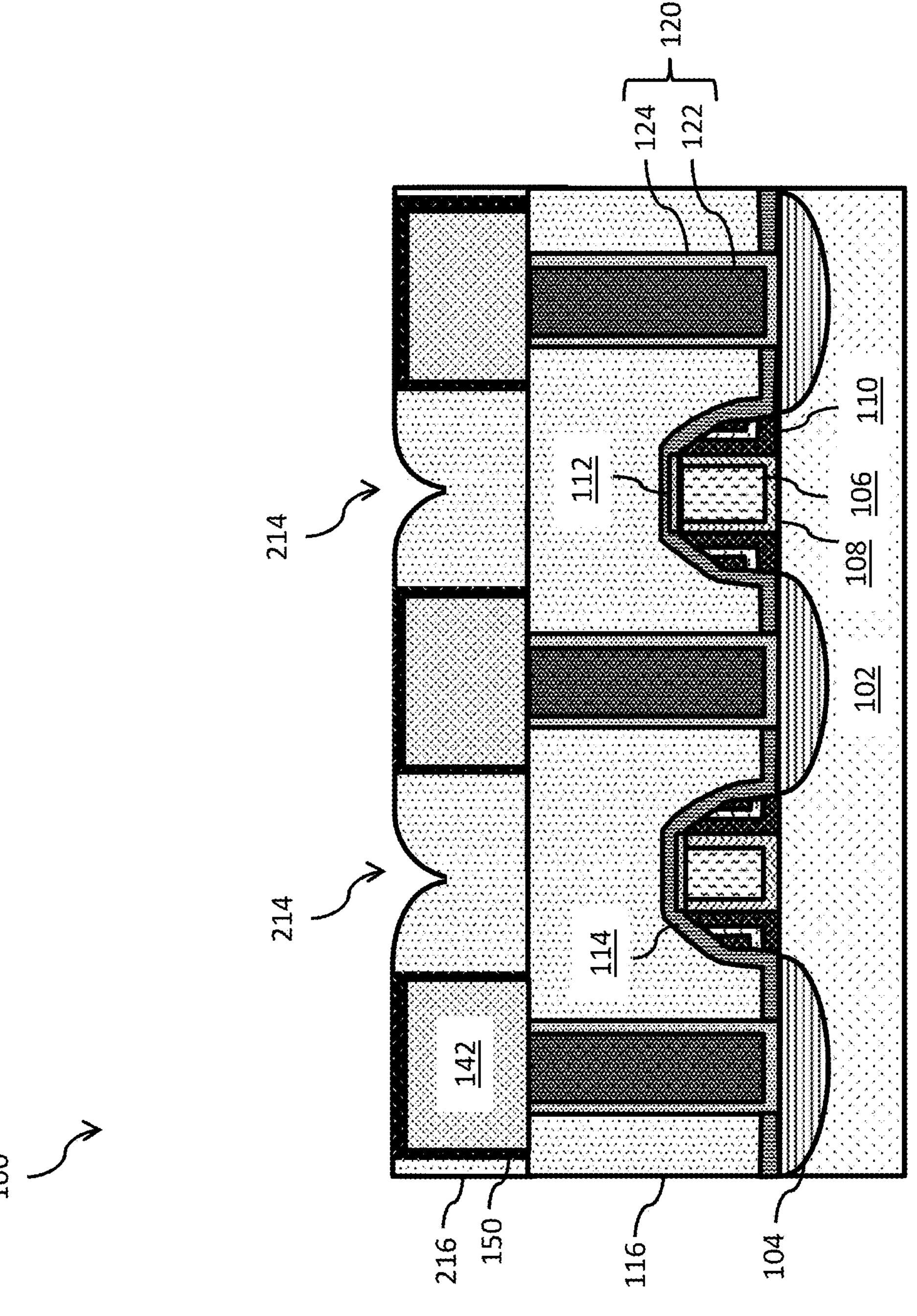

Next, in FIG. 28, the IMD layer 212 is recessed to form an IMD layer 216 by a suitable anisotropic etch process (also referred to as a straight etch), such as a dry etch (e.g., a plasma process performed with $CF_4$ gas or a RIE process). In some embodiments, the anisotropic etch process exposes a top surface of the protective cap layer 150. The protective cap layer 150 may be thinned by the anisotropic etch process. In other embodiments where the protective cap layer 150 is not present on top surfaces of the conductive features 142, the top surfaces of the conductive features 142 are exposed by the anisotropic etch process. After the anisotropic etch process, the dents 214 extend below the top surfaces of the conductive features 142.

Figure 29:
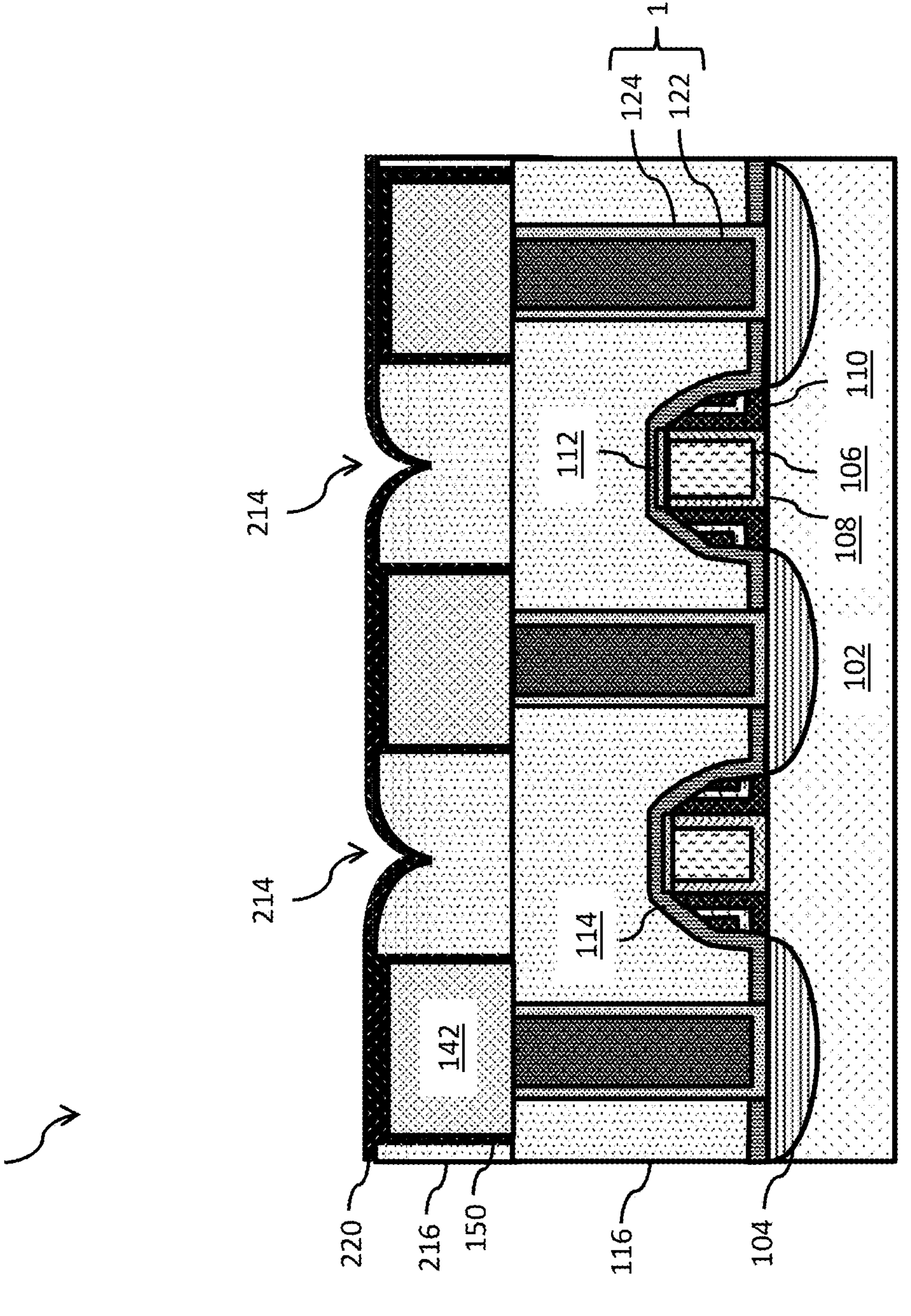

In FIG. 29, a protective layer 220 is formed over the IMD layer 216, the protective cap layer 150 (if present), and the conductive features 142. The protective layer 220 may be formed using similar methods and materials as the protective layer 134 as described above with respect to FIG. 2, and the details are not repeated herein. In some embodiments, the protective layer 220 has a curved corner profile in a cross-sectional view where it covers the dents 214.

Figure 30:
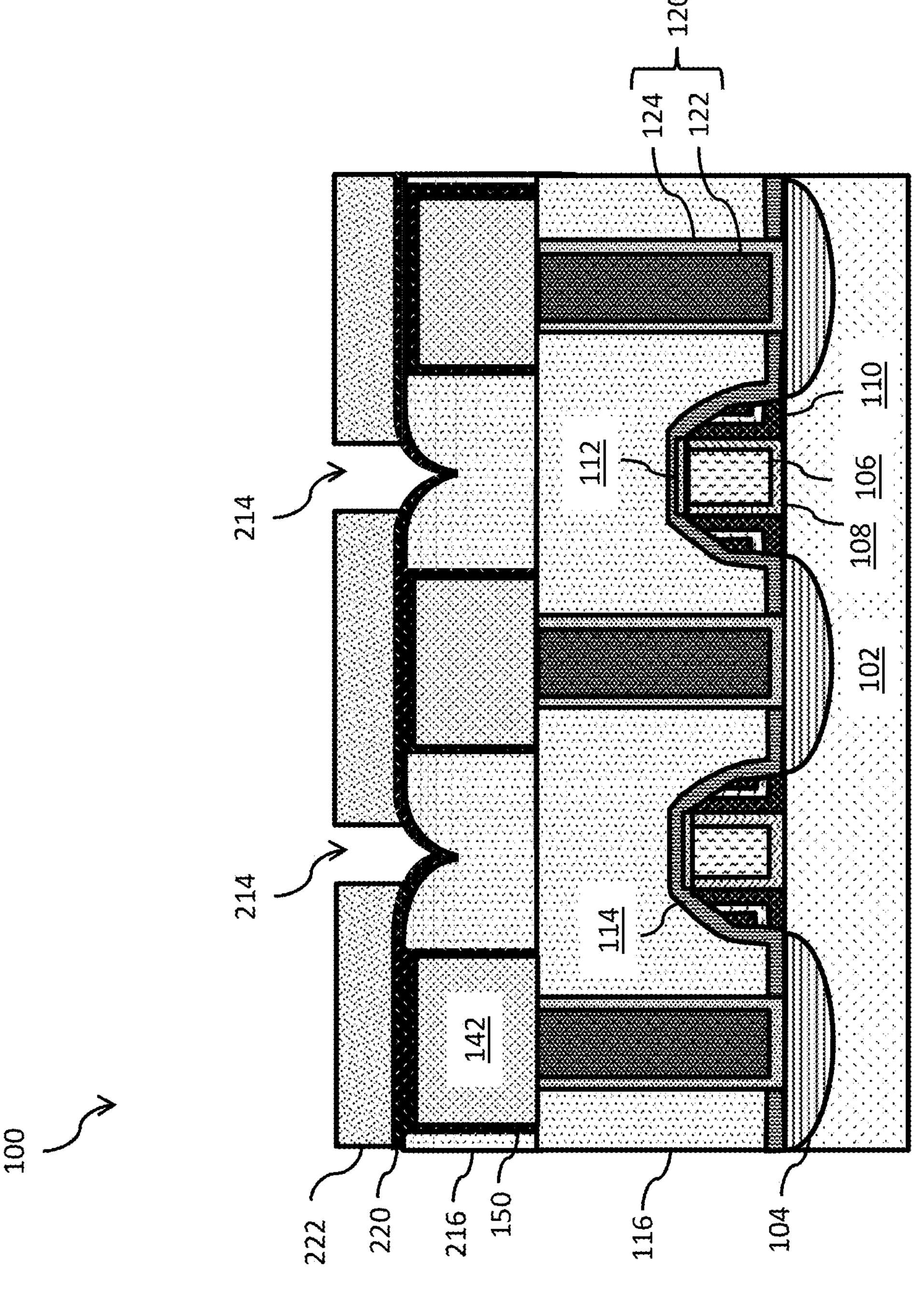

Next, in FIG. 30, a photomask 222 is formed over the protective layer 220. Gaps in the patterned photomask 222 expose portions of the protective layer 220 over the dents 214. The photomask 222 is subsequently used as an etching mask to etch holes through the dents 214 (see below, FIGS. 31-32). The photomask 222 may be formed using similar methods and materials as the photomask 136 as described above with respect to FIG. 2, and the details are not repeated herein.

Figure 31:
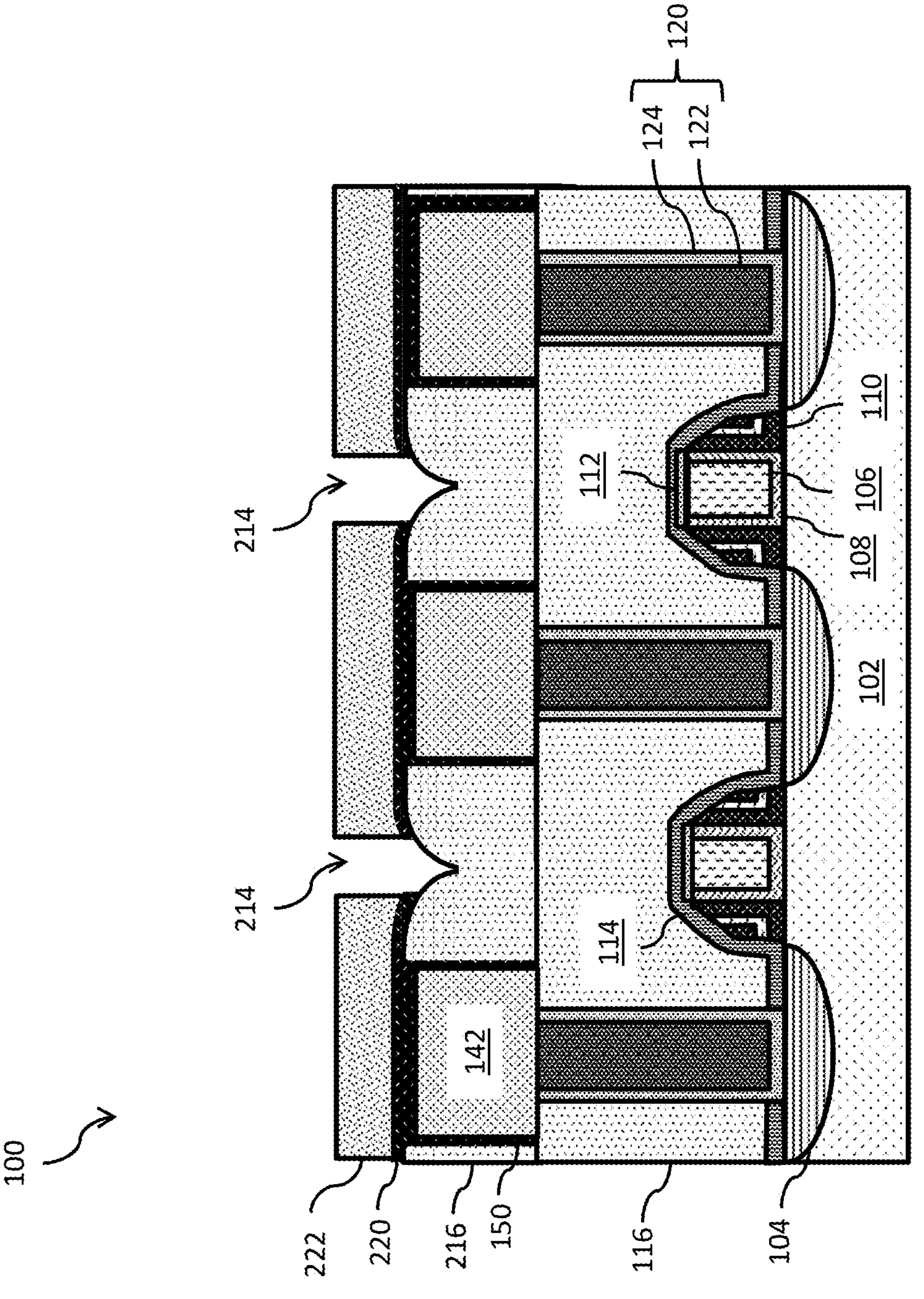

In FIG. 31, the portions of the protective layer 220 over the dents 214 that are exposed by the photomask 222 are removed. The portions of the protective layer 220 may be removed by a suitable anisotropic etch process that is selective to the material of the protective layer 220 (e.g., a nitride such as $Si_3N_4$). In some embodiments, the anisotropic etch process is a dry etch (e.g., a plasma process performed with $CF_4$ gas or a RIE process). However, any suitable etch process may be used. Remaining portions of the protective layer 220 have respective umbrella shaped profiles in a cross-sectional view.

Figure 32:
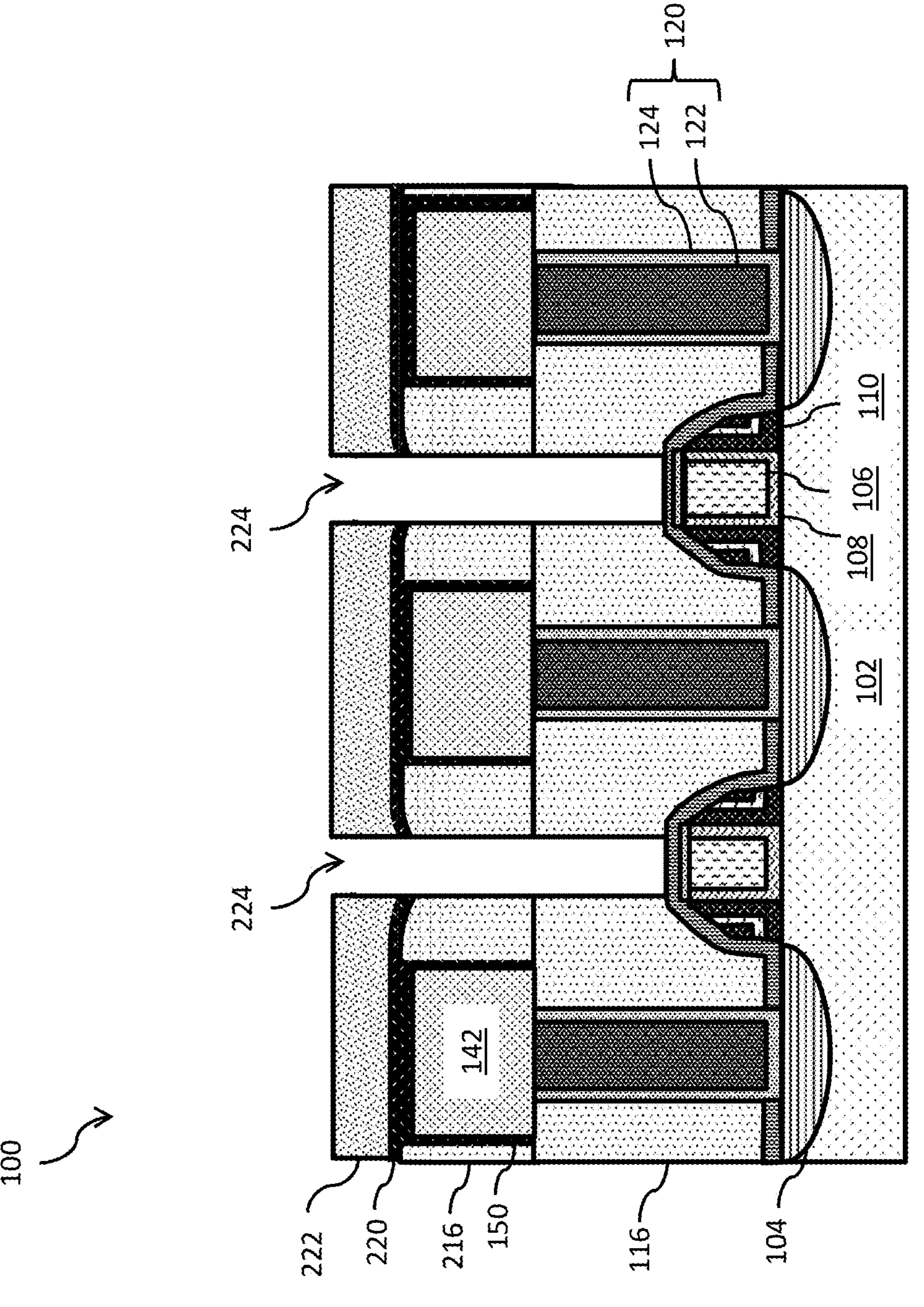

In FIG. 32, the photomask 222 is used to etch holes 224 through the IMD layer 216 and into the PMD layer 116 in the positions of the dents 214. The IMD layer 216 and the PMD layer 116 may be etched by a suitable anisotropic etch process that is selective to the material of the IMD layer 216 and the PMD layer 116 (e.g., silicon dioxide). In some embodiments, the anisotropic etch process is a dry etch (e.g., a plasma process performed with fluorocarbon reactants such as $CHF_3$, $CF_4$, or the like, or a RIE process). However, any suitable etch process may be used.

Figure 33:
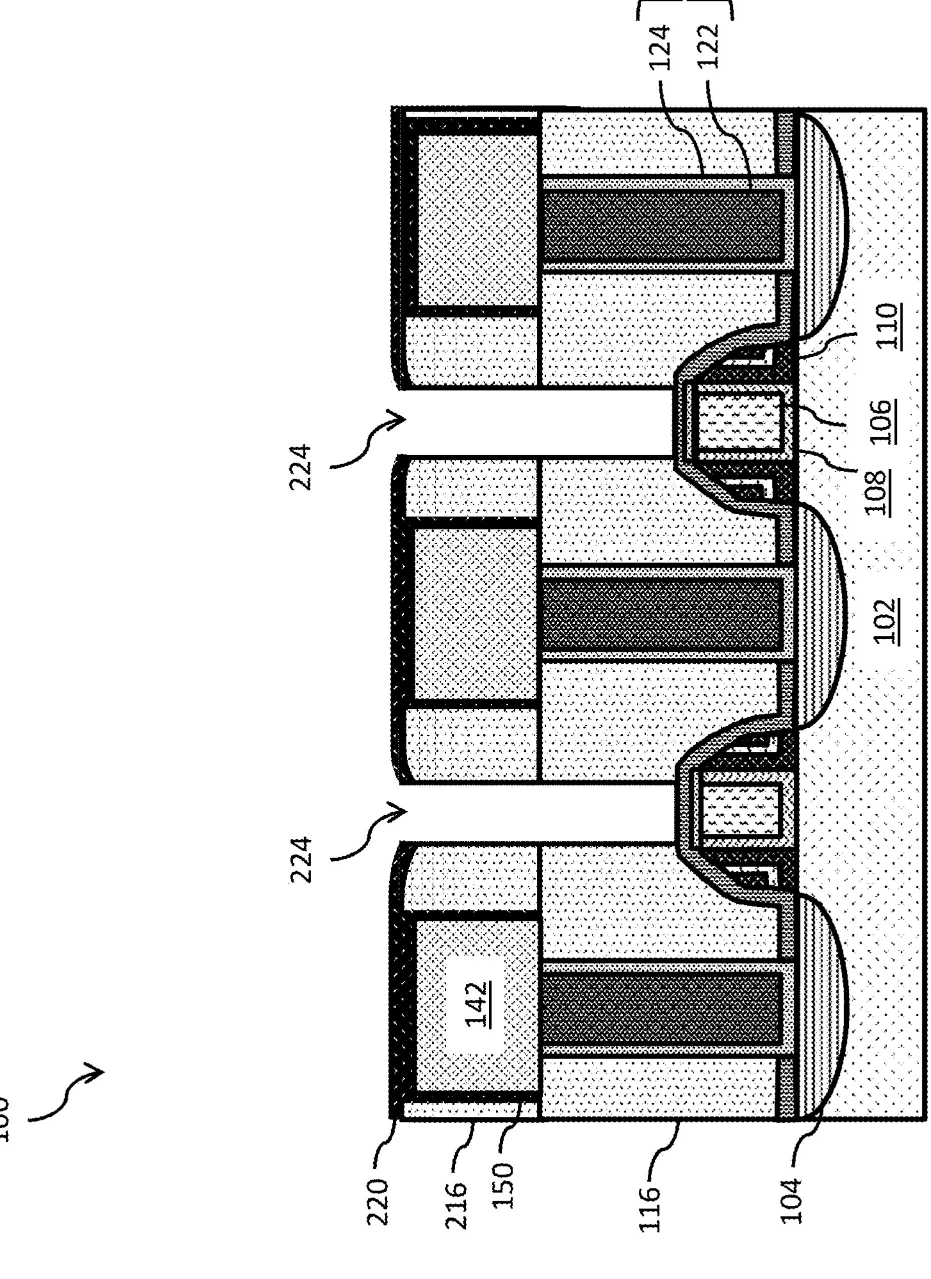

Next, in FIG. 33, the photomask 222 is removed to expose the protective layer 220. The photomask 222 may be removed by any suitable process, such as an ashing process.

Figure 34:
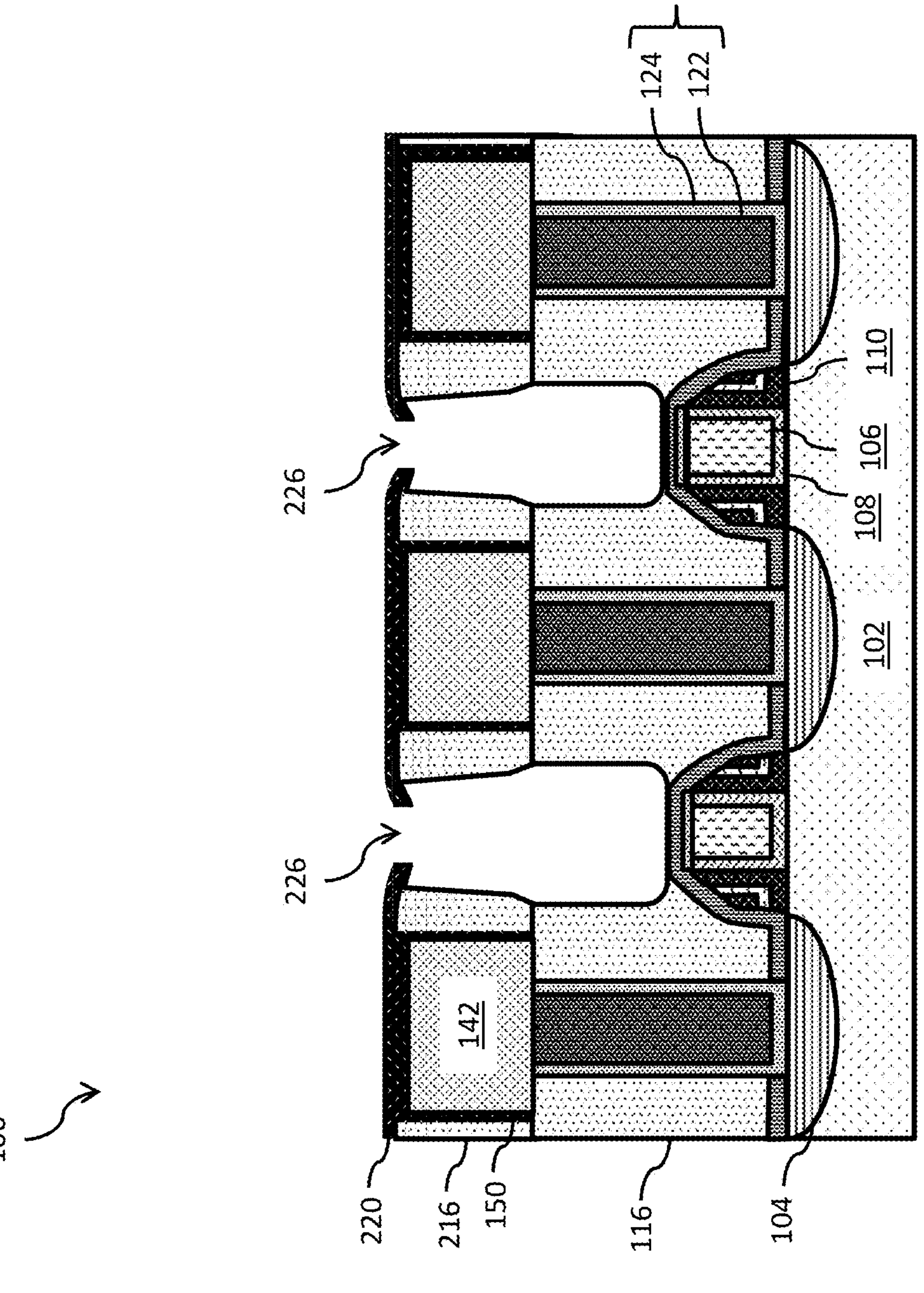

In FIG. 34, the holes 224 are widened to spaces 226 by an isotropic etch process. The isotropic etch process may be performed using similar methods and reactants as the isotropic etch process described above with respect to FIG. 9, and the details are not repeated herein. In some embodiments, curved tips of the protective layer 220 extend over the spaces 226.

Figure 35:
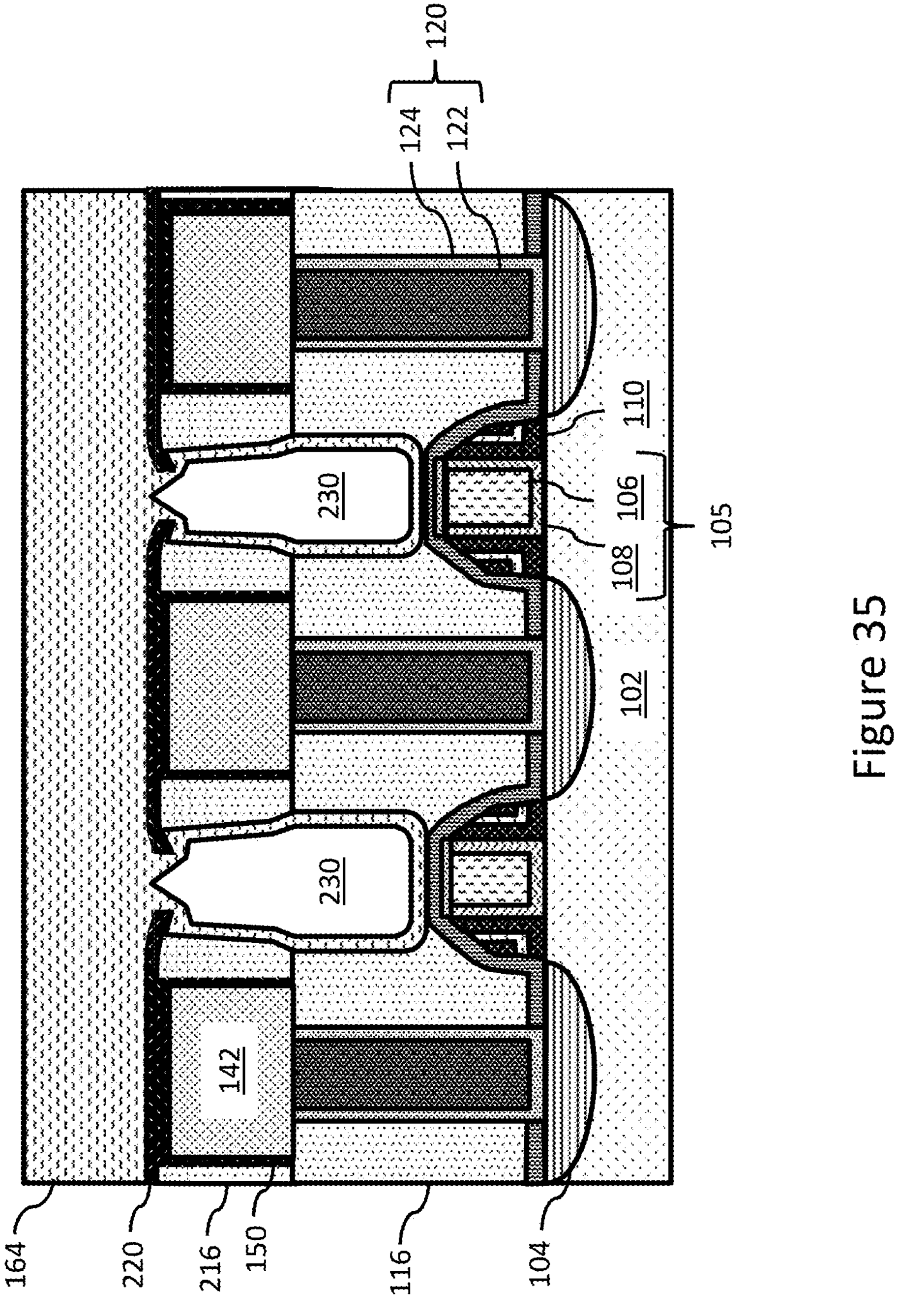

In FIG. 35, an IMD layer 164 is formed over the protective layer 220 and exposed surfaces of the spaces 226 to form air gaps 230. The IMD layer 164 may be formed using similar materials and methods as the IMD layer 152 as described above with respect to FIG. 6, and the details are not repeated herein. The IMD layer 164 seals the air gaps 230, and material of the IMD layer 164 may cover inner surfaces of the air gaps 230. In some embodiments, the air gaps 230 are above the transistor gate structures 105. Seams at the tops of the air gaps 162 may be truncated below an upper surface of the protective layer 220, so that highest points of the air gaps 162 are below a top surface of the protective layer. This may be due to the umbrella shaped profile of the protective layer 220 allowing more material of the IMD layer 164 to enter and fill top portions of the spaces 226 (see above, FIG. 34).

Figure 36A:
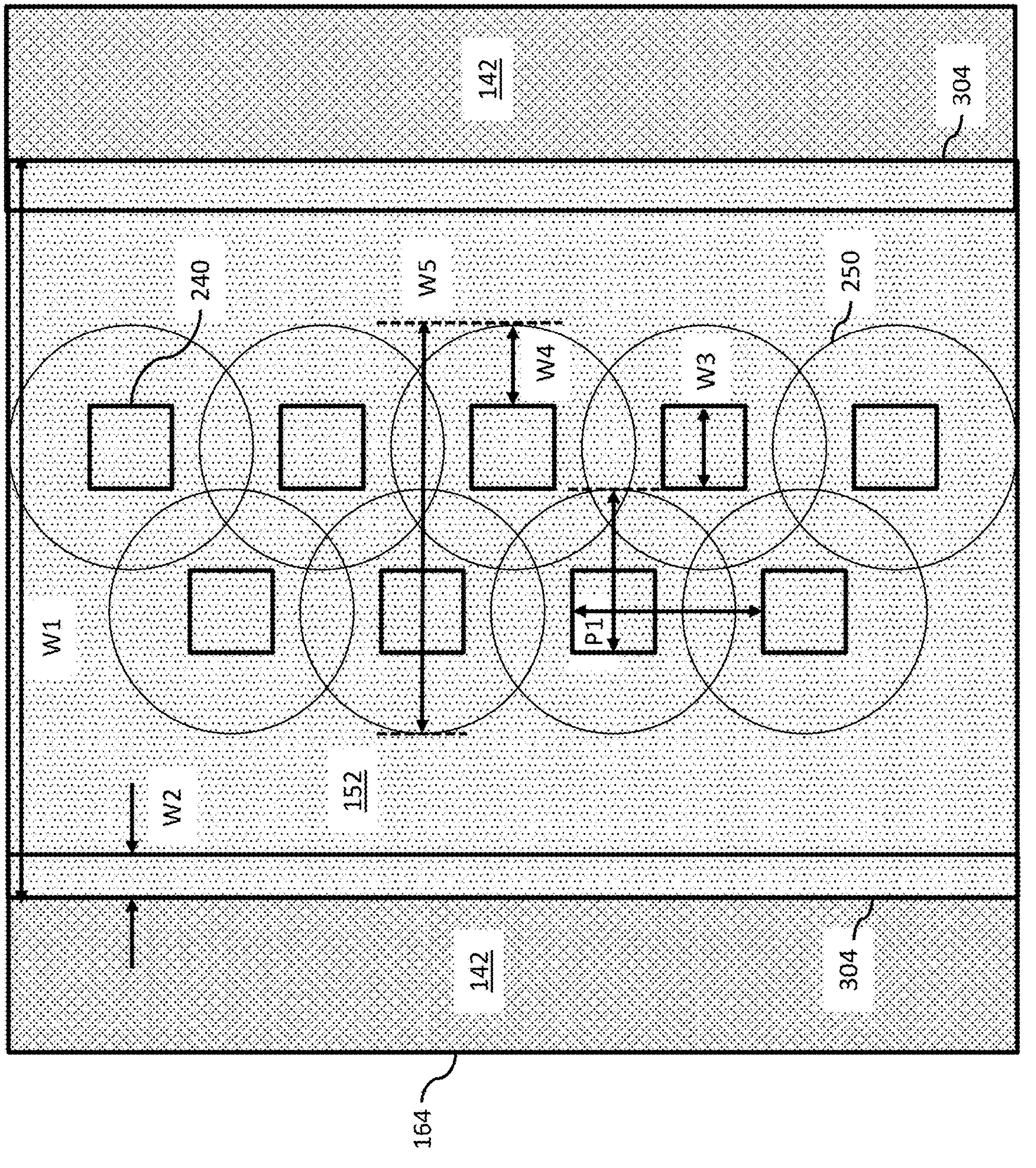
FIGS. 36A-36C illustrate top and cross-sectional views of semiconductor devices, in accordance with some embodiments.
Figure 36B:
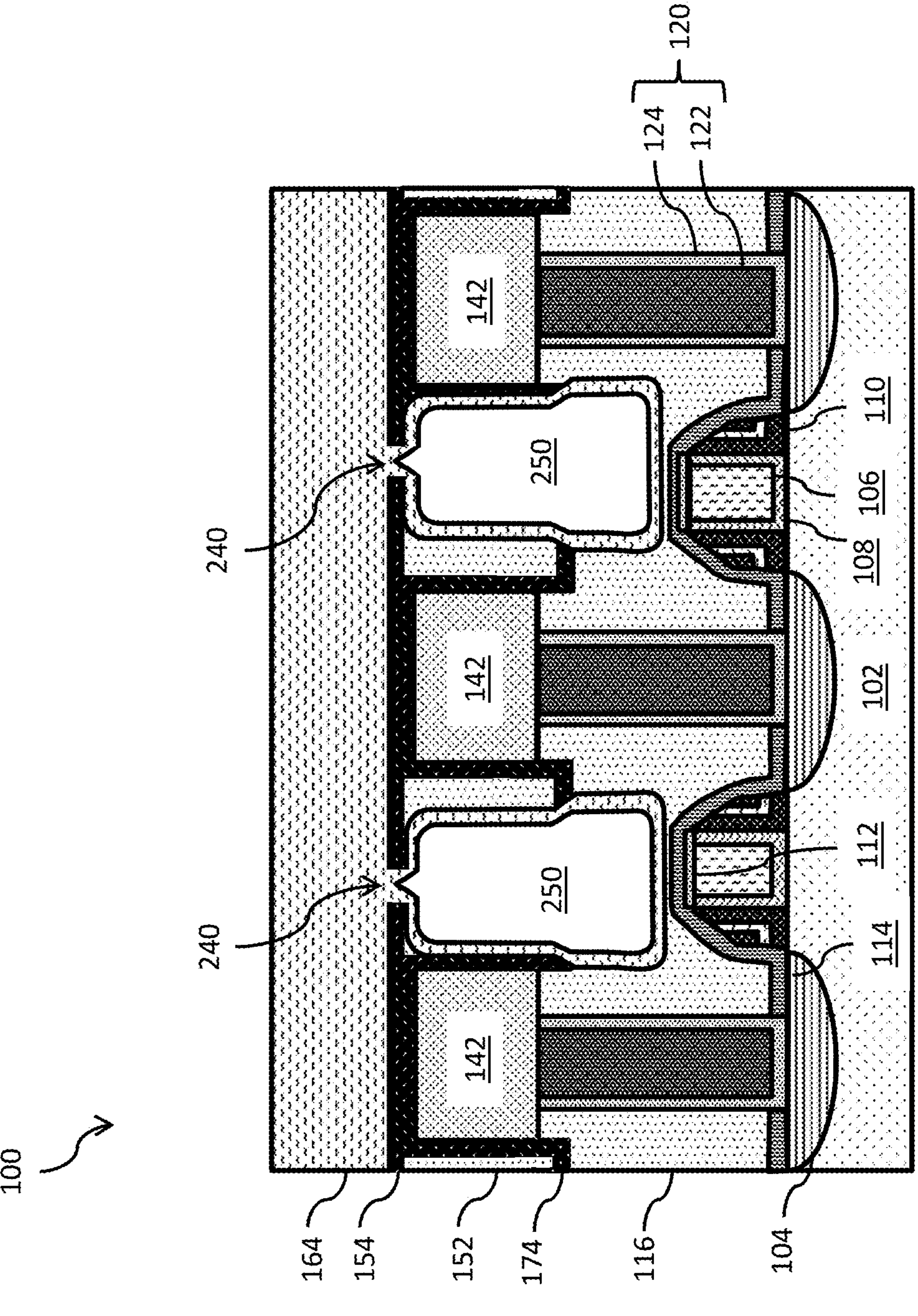
Figure 36C:
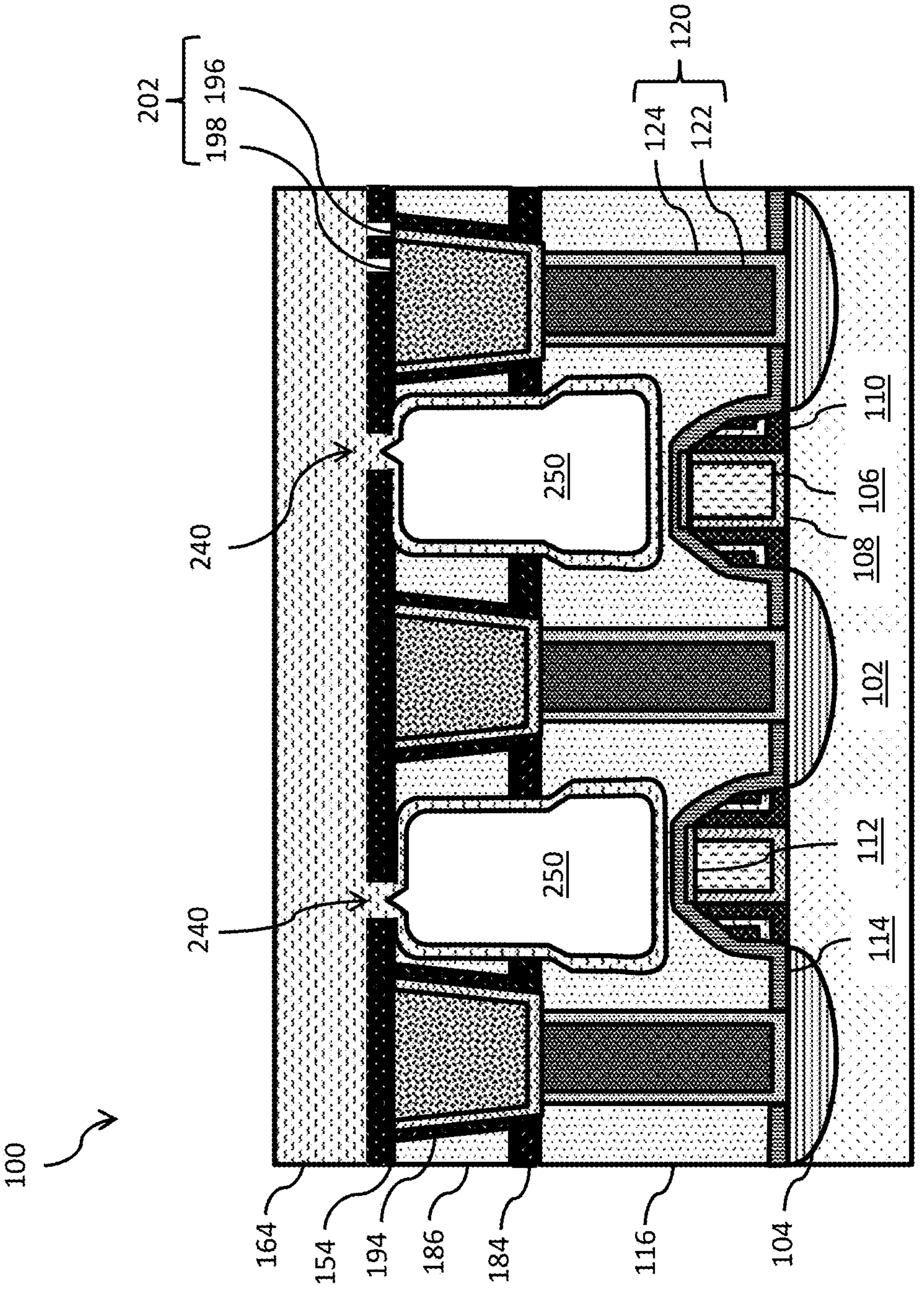

FIGS. 36A-36C illustrate embodiments of an expanded air gap formed by an isotropic etch performed through multiple staggered holes in a protective layer. FIG. 36A illustrates a plan view of a semiconductor structure 100 (e.g., similar to the structures illustrated in FIG. 10, 17, or 26) at the level of conductive features 142 (e.g., metal lines) and an IMD layer 152 between the conductive features 142. In some embodiments, the IMD layer 142 has a width W1 measured between the conductive features 142 in a range of 0.200 μm to 5 μm. The IMD layer 142 has forbidden areas 304 adjacent to each conductive features 142 that are desirably not etched to form air gaps in order to avoid damage to the conductive features 142. The forbidden areas 304 have widths W2 in a range of 0.01 μm to 1 μm. The forbidden areas 304 may desirably have widths W2 closer to the minimum of the range (0.01 μm) rather than the maximum of the range in order to achieve a wider air gap.

Openings 240 through a protective layer 154 (see below, FIGS. 36B-36C) above the IMD layer 152 are arranged in a staggered pattern. The openings 240 may be formed using similar methods as the holes 158 as described above with respect to FIG. 8, and the details are not repeated herein. Although the openings 240 are illustrated as having square shapes, the openings 240 may have any suitable shape, such as rectangular shapes, circular shapes, oval shapes, triangular shapes, hexagonal shapes, octagonal shapes, or the like. For example, the openings 240 could have alternating square and rectangular shapes, or alternating circular and oval shapes. In some embodiments, the openings 240 have widths W3 in a range of 50 nm to 300 nm.

The openings 240 are arranged in a staggered pattern, which is useful for allowing a merged air gap to be subsequently formed. As illustrated in FIG. 36A, the openings 240 are arranged in two columns between the conductive features 142. However, the openings 240 may be arranged in any suitable number of columns, such as one to five columns. The openings 240 of each column are offset from respective openings of the other column so that each opening 240 forms a triangle with the two nearest other openings 240 in a plan view. In some embodiments, the openings 240 are arranged with a pitch P1 in a range of 50 nm to 200 nm or 300 nm, with the maximum value depending on the HF etch rate. However, the openings 240 may be arranged in any suitable pattern. For example, the openings 240 may be separated by different pitches.

After forming the openings 240, an air gap 250 is formed by an isotropic etch process followed by sealing with the formation of an IMD layer 164 (see below, FIGS. 36B-36C). The air gap 250 is illustrated by overlapping circles around each opening 240. The isotropic etch process may be performed using similar methods as described above with respect to FIG. 9. The isotropic etch process expands each opening 240 by a width W4 in a range of 0 μm to 0.5 μm so that the widened openings merge together, as illustrated by the overlapping circles. The merged, widened opening may be sealed to form the air gap 250 by forming an IMD layer 164 over it, which may be formed using similar methods and materials as described above with respect to FIG. 10. The size of the air gap 250 may be advantageously increased with the staggered pattern of the openings 240 followed by the isotropic etch process, which may allow for the lowering of the dielectric constant of the IMD layer 152.

In some embodiments, the air gap 250 has a width W5 in a range of 0.1 μm to 4.98 μm, which is equal to the sum of twice the width W3 with the width W4 and the pitch P1. The anisotropic etch process to form the openings 240 and the isotropic etch process to widen the openings 240 (thereby forming the merged air gap 250) may be performed so that the width W5 of the air gap 250 is less than or equal to the width W1 of the IMD layer 152 minus the combined widths W2 of the forbidden areas 304.

FIG. 36B illustrates a cross-sectional view of a semiconductor structure 100 similar to the embodiment of FIG. 18 (e.g., with conductive features 142 formed with a subtractive process) with staggered openings 240 formed through the protective layer 154. As a result, the air gaps 250 are wider than the air gaps 182 (see above, FIG. 18), Additionally, seams at the tops of the air gaps 250 may be lower than seams at the tops of the air gaps 182, such that highest points of the air gaps 250 are below a top surface of the protective layer 154. The openings 240 and the air gaps 250 may be asymmetrically closer to a first conductive feature 142 than to a second conductive feature 142 (e.g., closer to the left conductive feature 142 or to the right conductive feature 142 than to the center conductive feature 142 as illustrated in FIG. 36B) due to the staggered pattern of the openings 240 and the resulting merged air gaps 250.

FIG. 36C illustrates a cross-sectional view of a semiconductor structure 100 similar to the embodiment of FIG. 26 (e.g., with conductive features 202 formed with a damascene process) with staggered openings 240 formed through the protective layer 154. As a result, the air gaps 250 are wider than the air gaps 182 (see above, FIG. 26). Additionally, seams at the tops of the air gaps 250 may be lower than seams at the tops of the air gaps 182, such that highest points of the air gaps 250 are below a top surface of the protective layer 154. The openings 240 and the air gaps 250 may be asymmetrically closer to a first conductive feature 202 than to a second conductive feature 202 (e.g., closer to the left conductive feature 202 or to the right conductive feature 202 than to the center conductive feature 202 as illustrated in FIG. 36C) due to the staggered pattern of the openings 240 and the resulting merged air gaps 250.

Figure 37:
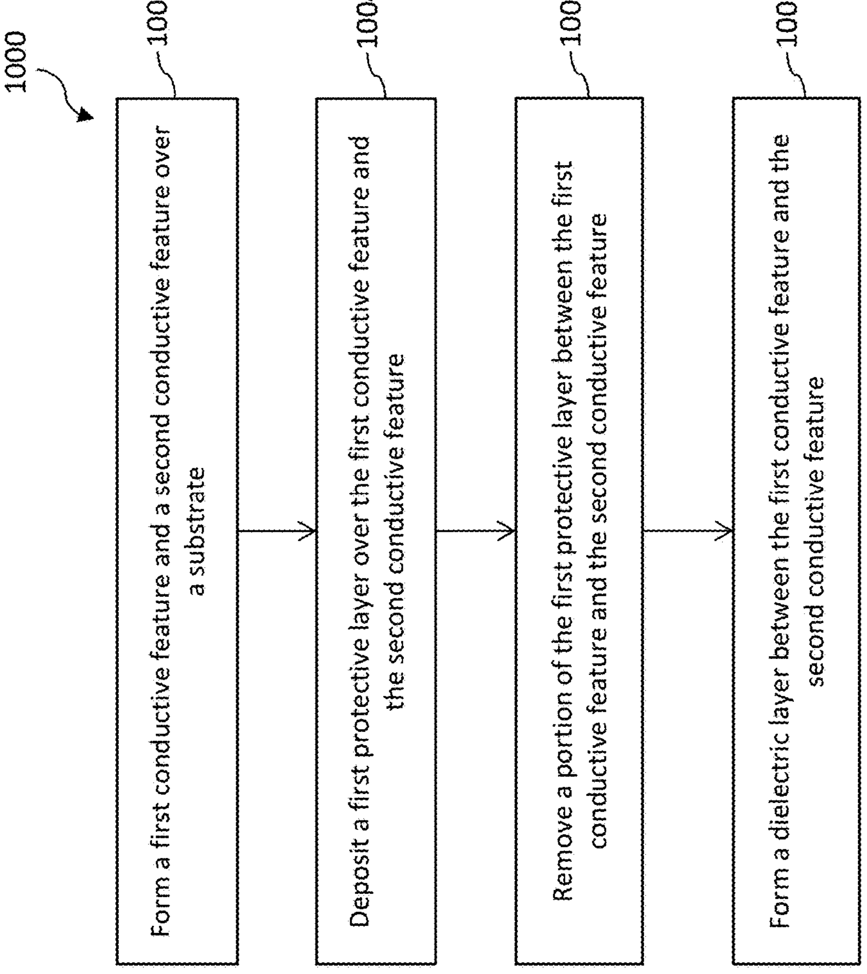
FIG. 37 illustrates a process flow chart diagram of a method for manufacturing a semiconductor device, in accordance with some embodiments.

FIG. 37 illustrates a process flow chart diagram of a method 1000 for manufacturing a semiconductor device, in accordance with some embodiments. In step 1002, a first conductive feature and a second conductive feature (e.g., conductive features 142) are formed over a substrate 102, as described above with respect to FIGS. 2-3.

In step 1004, a first protective layer (e.g., a protective layer 148) is deposited over the first conductive feature and the second conductive feature, as described above with respect to FIG. 4. The first protective layer covers respective sidewalls and top surfaces of the first conductive feature and the second conductive feature.

In step 1006, a portion of the first protective layer between the first conductive feature and the second conductive feature is removed, as described above with respect to FIG. 5. In step 1008, after removing the portion of the first protective layer, an intermetal dielectric layer 152 is formed between the first conductive feature and the second conductive feature, as described above with respect to FIG. 6.

Figure 38:
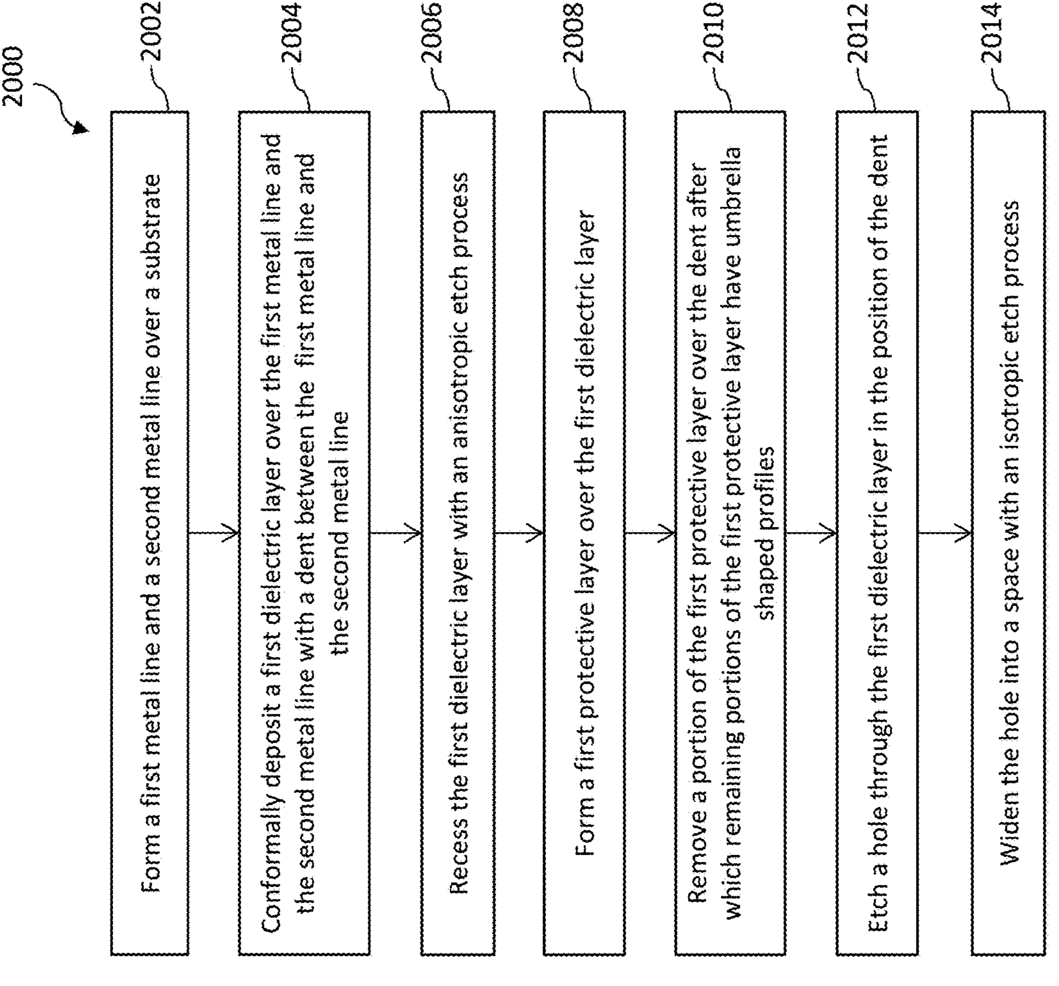
FIG. 38 illustrates a process flow chart diagram of another method for manufacturing a semiconductor device, in accordance with some embodiments.

FIG. 38 illustrates a process flow chart diagram of a method 2000 for manufacturing a semiconductor device, in accordance with some embodiments. In step 2002, a first metal line (e.g., a conductive feature 142) and a second metal line (e.g., a conductive feature 142) are formed over a substrate 102, as described above with respect to FIGS. 2-3.

In step 2004, a first dielectric layer (e.g., an IMD layer 212) is conformally deposited over the first metal line and the second metal line, as described above with respect to FIG. 27. The first dielectric layer comprises a dent 214 between the first metal line and the second metal line.

In step 2006, the first dielectric layer is recessed with an anisotropic etch process, as described above with respect to FIG. 28. After the anisotropic etch process, the dent 214 extends below top surfaces of the first metal line and the second metal line.

In step 2008, a first protective layer (e.g., a protective layer 220) is formed over the first dielectric layer, as described above with respect to FIG. 29. In step 2010, a portion of the first protective layer over the dent 214 is removed, as described above with respect to FIGS. 30-31. Remaining portions of the first protective layer have respective umbrella shaped profiles in a cross-sectional view.

In step 2012, a hole 224 is etched through the first dielectric layer in the position of the dent 214, as described above with respect to FIG. 32. In step 2014, the hole 224 is widened into a space 226 with an isotropic etch process, as described above with respect to FIG. 34.

Example embodiments of the disclosure are summarized here. Other embodiments can also be understood from the entirety of the specification as well as the claims filed herein.

Example 1. A method for manufacturing a semiconductor device, the method including: forming a first conductive feature and a second conductive feature over a substrate; depositing a first protective layer over the first conductive feature and the second conductive feature, the first protective layer covering respective sidewalls and top surfaces of the first conductive feature and the second conductive feature; removing a portion of the first protective layer between the first conductive feature and the second conductive feature; and after removing the portion of the first protective layer, forming an intermetal dielectric layer between the first conductive feature and the second conductive feature.

Example 2. The method of example 1, further including forming a second protective layer over the first protective layer and the intermetal dielectric layer.

Example 3. The method of example 2, where the first protective layer and the second protective layer include a nitride.

Example 4. The method of one of examples 2 or 3, further including etching an opening through the second protective layer.

Example 5. The method of example 4, where etching the opening includes performing a dry etch with $CF_4$.

Example 6. The method of one of examples 4 or 5, further including widening the opening by etching the intermetal dielectric layer.

Example 7. The method of example 6, where etching the intermetal dielectric layer includes performing a wet etch process with HF.

Example 8. A method for manufacturing a semiconductor device, the method including: forming a first metal line and a second metal line over a substrate; conformally depositing a first dielectric layer over the first metal line and the second metal line, where the first dielectric layer includes a dent between the first metal line and the second metal line; recessing the first dielectric layer with an anisotropic etch process, where after the anisotropic etch process the dent extends below top surfaces of the first metal line and the second metal line; forming a first protective layer over the first dielectric layer; removing a portion of the first protective layer over the dent, where remaining portions of the first protective layer have respective umbrella shaped profiles in a cross-sectional view; etching a hole through the first dielectric layer in the position of the dent; and widening the hole into a space with an isotropic etch process.

Example 9. The method of example 8, where the first protective layer includes a nitride.

Example 10. The method of one of examples 8 or 9, where the nitride is $Si_3N_4$.

Example 11. The method of one of examples 8 to 10, further including forming an air gap by depositing a second dielectric layer over the first protective layer and the hole.

Example 12. The method of example 11, where a highest points of the air gap is below a top surface of the first protective layer.

Example 13. The method of one of examples 11 or 12, where curved tips of the first protective layer extend over the air gap.

Example 14. The method of one of examples 8 to 13, further including forming a second protective layer over sidewalls of the first metal line and the second metal line.

Example 15. The method of example 14, where the first protective layer and the second protective layer are a same material.

Example 16. A semiconductor device including: a first conductive feature and a second conductive feature over a substrate; a dielectric layer between the first conductive feature and the second conductive feature; an air gap in the dielectric layer between the first conductive feature and the second conductive feature; a protective layer over the first conductive feature, the second conductive feature, and the dielectric layer; and a first opening through the protective layer, a second opening through the protective layer, and a third opening through the protective layer, the first opening, the second opening, and the third opening being over the air gap, where the first opening, the second opening, and the third opening form a triangle in a plan view.

Example 17. The semiconductor device of example 16, where the protective layer includes nitride.

Example 18. The semiconductor device of one of examples 16 or 17, where the protective layer further covers sidewalls of the first conductive feature and the second conductive feature.

Example 19. The semiconductor device of one of examples 16 to 18, where a highest point of the air gap is below a top surface of the protective layer.

Example 20. The semiconductor device of one of examples 16 to 19, where the air gap is over a transistor gate structure.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A method for manufacturing a semiconductor device, the method comprising:

forming a first metal line and a second metal line over a substrate;

conformally depositing a first dielectric layer over the first metal line and the second metal line, wherein the first dielectric layer comprises a dent between the first metal line and the second metal line;

recessing the first dielectric layer with an anisotropic etch process, wherein after the anisotropic etch process the dent extends below top surfaces of the first metal line and the second metal line;

forming a first protective layer over the first dielectric layer;

removing a portion of the first protective layer over the dent, wherein remaining portions of the first protective layer have respective umbrella shaped profiles in a cross-sectional view;

etching a hole through the first dielectric layer in the position of the dent; and widening the hole into a space with an isotropic etch process.

2. The method of claim 1, wherein the first protective layer comprises a nitride.

3. The method of claim 2, wherein the nitride is $Si_3N_4$.

4. The method of claim 1, further comprising forming an air gap by depositing a second dielectric layer over the first protective layer and the space.

5. The method of claim 4, wherein a highest point of the air gap is below a top surface of the first protective layer.

6. The method of claim 4, wherein curved tips of the first protective layer extend over the air gap.

7. The method of claim 1, further comprising forming a second protective layer over sidewalls of the first metal line and the second metal line.

8. The method of claim 7, wherein the first protective layer and the second protective layer are a same material.

9. A method for manufacturing a semiconductor device, the method comprising:

forming a first dielectric layer over a first metal line and a second metal line, wherein the first dielectric layer comprises a dent between the first metal line and the second metal line;

extending the dent below top surfaces of the first metal line and the second metal line by performing a first etch process on the first dielectric layer;

forming a protective layer over the first dielectric layer;

forming umbrella shaped profiles in the protective layer by removing a portion of the protective layer over the dent;

etching a hole through the first dielectric layer in the position of the dent; and widening the hole into a space with a second etch process.

10. The method of claim 9, wherein the first etch process is an anisotropic etch process.

11. The method of claim 9, wherein the second etch process is an isotropic etch process.

12. The method of claim 9, wherein forming the protective layer comprises forming a curved corner profile of the protective layer in a cross-sectional view.

13. The method of claim 9, wherein the protective layer comprises a nitride.

14. The method of claim 9, further comprising forming a second dielectric layer over the umbrella shaped profiles of the protective layer.

15. A method for manufacturing a semiconductor device, the method comprising:

conformally depositing a first dielectric layer over a first metal line and a second metal line;

recessing the first dielectric layer with a first etch process, a dent between the first metal line and the second metal line extending below top surfaces of the first metal line and the second metal line after the first etch process;

forming a protective layer over the first dielectric layer;

removing a portion of the protective layer over the dent, remaining portions of the protective layer having respective umbrella shaped profiles in a cross-sectional view;

etching a hole through the first dielectric layer in the position of the dent; and widening the hole with a second etch process.

16. The method of claim 15, wherein the first etch process is an anisotropic etch process.

17. The method of claim 15, wherein the second etch process is an isotropic etch process.

18. The method of claim 15, wherein the protective layer comprises silicon nitride.

19. The method of claim 15, wherein curved tips of the protective layer extend over the hole after the second etch process.

20. The method of claim 15, further comprising sealing an air gap by forming a second dielectric layer over the hole.

* * * * *